(12) United States Patent
Arai et al.

(10) Patent No.: US 9,170,003 B2
(45) Date of Patent: Oct. 27, 2015

(54) LIGHT-EMITTING ELEMENT MOUNTING SUBSTRATE AND LIGHT-EMITTING DEVICE

(75) Inventors: Takeyuki Arai, Kagoshima (JP); Minoru Nakasuga, Kagoshima (JP); Tetsurou Nakamoto, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 246 days.

(21) Appl. No.: 13/989,570

(22) PCT Filed: Nov. 25, 2011

(86) PCT No.: PCT/JP2011/077212
§ 371 (c)(1),
(2), (4) Date: May 24, 2013

(87) PCT Pub. No.: WO2012/070648
PCT Pub. Date: May 31, 2012

(65) Prior Publication Data
US 2013/0242565 A1    Sep. 19, 2013

(30) Foreign Application Priority Data

Nov. 25, 2010  (JP) ................................. 2010-262572
Jan. 28, 2011  (JP) ................................. 2011-016747
Mar. 17, 2011  (JP) ................................. 2011-059470

(51) Int. Cl.
*F21V 19/00*    (2006.01)
*F21V 21/00*    (2006.01)
(Continued)

(52) U.S. Cl.
CPC .............. *F21V 21/00* (2013.01); *H01L 33/486* (2013.01); *H01L 33/60* (2013.01);
(Continued)

(58) Field of Classification Search
CPC .......... H01L 33/60; H01L 33/62; F21V 21/00
USPC .............................. 362/296.04, 382; 313/512
See application file for complete search history.

(56) References Cited

U.S. PATENT DOCUMENTS

2006/0220050 A1  10/2006  Higaki et al.
2008/0043444 A1   2/2008  Hasegawa et al.
(Continued)

FOREIGN PATENT DOCUMENTS

JP    2006156447 A    6/2006
JP    2006228856 A    8/2006
(Continued)

OTHER PUBLICATIONS

International Search Report, PCT/JP2011/077212, Feb. 8, 2012, 2 pp.
(Continued)

*Primary Examiner* — Andrew Coughlin
(74) *Attorney, Agent, or Firm* — Volpe and Koenig, P.C.

(57) ABSTRACT

There are provided a light-emitting element mounting substrate having high bonding strength between a substrate main body and a metal portion, and a light-emitting device having high bonding strength between the substrate main body and the metal portion and high reliability. A light-emitting element mounting substrate includes a substrate main body (20) formed of a ceramic sintered body; and a silver-containing metal portion (2), a silver-containing region (4) existing in a portion of the substrate main body which faces the metal portion across a bonding portion bonding the substrate main body and the silver-containing metal portion. Accordingly, it is possible to increase bonding strength between the substrate main body (20) and the metal portion (2).

9 Claims, 10 Drawing Sheets

(51) Int. Cl.
*H01L 33/48* (2010.01)
*H01L 33/60* (2010.01)

(52) U.S. Cl.
CPC .............. *H01L 2224/48091* (2013.01); *H01L 2224/48227* (2013.01); *H01L 2224/48465* (2013.01); *H01L 2224/73265* (2013.01)

(56) References Cited

U.S. PATENT DOCUMENTS

2011/0108875 A1  5/2011  Takenaka et al.
2011/0169037 A1  7/2011  Hasegawa et al.

FOREIGN PATENT DOCUMENTS

| | | |
|---|---|---|
| JP | 2007042745 A | 2/2007 |
| JP | 2007284333 A | 11/2007 |
| JP | 2008192635 A | 8/2008 |
| JP | 2009231440 A | 10/2009 |
| JP | 2010010279 A | 1/2010 |
| WO | 2005020338 A1 | 3/2005 |

OTHER PUBLICATIONS

Japanese Office Action, Japanese Patent Application No. 2012-270406, with Statement of Relevance of Non-English References, Sep. 3, 2013, 6 pp.

FIG. 13

| Sample No. | Main component of Substrate main body | Reflectance of Substrate (%) | Region Presence or Absence | First region Presence or Absence | Second region Presence or Absence | Thickness of region (μm) | Bonding strength of Metal portion | | | | Reflectance of Metal portion | | | |
|---|---|---|---|---|---|---|---|---|---|---|---|---|---|---|
| | | | | | | | Initial value (MPa) | After 100 hours (MPa) | After 500 hours (MPa) | After 1,000 hours (MPa) | Initial value (%) | After 100 hours (%) | After 500 hours (%) | After 1,000 hours (%) |
| 101A | Aluminum oxide | 92.4 | Presence | Presence | Presence | 11 | 15.7 | 15.7 | 15.6 | 15.5 | 90.8 | 90.7 | 90.5 | 88.4 |
| 101B | Aluminum oxide | 92.4 | Absence | Absence | Absence | - | 13.2 | 13.0 | 11.2 | 10.7 | 90.7 | 80.5 | 73.5 | 64.9 |
| 102A | Zirconium oxide | 89.7 | Presence | Presence | Presence | 3 | 12.1 | 10.1 | 9.7 | 9.6 | 90.5 | 90.2 | 89.8 | 86.5 |
| 102B | Zirconium oxide | 89.7 | Absence | Absence | Absence | - | 9.4 | 9.3 | 9.1 | 9.0 | 90.6 | 80.4 | 73.6 | 65.0 |

FIG. 14

| Sample No. | Paste of first electrode | Region Presence or Absence | First region Presence or Absence | Second region Presence or Absence | Bonding strength of Metal portion | | | | Reflectance of Metal portion | | | |
|---|---|---|---|---|---|---|---|---|---|---|---|---|
| | | | | | Initial value (MPa) | After 100 hours (MPa) | After 500 hours (MPa) | After 1,000 hours (MPa) | Initial value (%) | After 100 hours (%) | After 500 hours (%) | After 1,000 hours (%) |
| 1A | A | Presence | Presence | Presence | 14.5 | 14.6 | 14.4 | 14.3 | 91.0 | 90.8 | 90.8 | 89.4 |
| 2A | A | Presence | Presence | Presence | 14.2 | 14.1 | 14.0 | 14.0 | 90.7 | 90.8 | 89.8 | 88.1 |
| 3A | A | Presence | Presence | Presence | 15.1 | 15.0 | 15.0 | 15.0 | 90.7 | 90.7 | 90.6 | 88.9 |
| 4A | A | Presence | Presence | Presence | 15.7 | 15.7 | 15.6 | 15.5 | 90.8 | 90.7 | 90.5 | 88.4 |
| 5A | A | Presence | Presence | Presence | 14.4 | 14.4 | 14.4 | 14.4 | 90.7 | 90.7 | 90.6 | 90.0 |
| 6A | A | Presence | Presence | Presence | 16.0 | 16.0 | 15.9 | 15.9 | 90.9 | 90.5 | 90.2 | 90.0 |
| 7A | A | Presence | Presence | Presence | 16.4 | 16.4 | 16.3 | 16.3 | 90.7 | 90.7 | 90.2 | 89.8 |
| 8A | A | Presence | Presence | Presence | 15.5 | 15.4 | 15.4 | 15.3 | 90.8 | 90.5 | 90.0 | 89.1 |
| 9A | A | Presence | Presence | Presence | 16.5 | 16.5 | 16.4 | 16.4 | 90.8 | 90.8 | 90.1 | 89.7 |
| 10A | A | Presence | Presence | Presence | 15.0 | 14.9 | 14.9 | 14.9 | 90.9 | 90.4 | 89.9 | 89.1 |
| 1B | B | Absence | Absence | Absence | 11.9 | 11.7 | 11.4 | 10.8 | 90.5 | 80.3 | 78.1 | 67.0 |
| 2B | B | Absence | Absence | Absence | 11.2 | 11.0 | 10.3 | 10.2 | 90.6 | 79.8 | 67.6 | 64.0 |
| 3B | B | Absence | Absence | Absence | 12.8 | 12.3 | 11.3 | 11.0 | 90.5 | 81.5 | 73.3 | 66.5 |
| 4B | B | Absence | Absence | Absence | 13.2 | 13.0 | 11.2 | 10.7 | 90.7 | 80.5 | 73.5 | 64.9 |
| 5B | B | Absence | Absence | Absence | 11.9 | 11.4 | 11.3 | 10.7 | 90.7 | 81.0 | 74.4 | 66.5 |
| 6B | B | Absence | Absence | Absence | 13.8 | 13.0 | 11.6 | 11.0 | 90.3 | 80.3 | 74.7 | 65.0 |
| 7B | B | Absence | Absence | Absence | 13.8 | 13.1 | 12.3 | 12.1 | 90.6 | 81.2 | 73.6 | 65.5 |
| 8B | B | Absence | Absence | Absence | 13.0 | 12.6 | 12.3 | 11.2 | 90.6 | 80.9 | 71.7 | 67.0 |
| 9B | B | Absence | Absence | Absence | 14.0 | 13.9 | 13.6 | 13.1 | 90.5 | 82.2 | 73.0 | 65.1 |
| 10B | B | Absence | Absence | Absence | 12.8 | 12.4 | 11.8 | 11.5 | 90.7 | 81.0 | 72.4 | 65.6 |

FIG. 15

| Sample No. | Thick film firing temperature (°C) | Region Presence or Absence | Thickness of Region (μm) | First region Presence or absence | Second region Presence or absence | Linearity of Pattern (μm) | Bonding strength of Metal portion (MPa) |
|---|---|---|---|---|---|---|---|
| 4A | 840 | Presence | 11 | Presence | Presence | 3 | 15.7 |
| 4A-1 | 780 | Presence | 4 | Presence | Presence | 2 | 9.2 |
| 4A-2 | 800 | Presence | 5 | Presence | Presence | 2 | 10.3 |
| 4A-3 | 870 | Presence | 13 | Presence | Presence | 6 | 16.2 |
| 4A-4 | 900 | Presence | 15 | Presence | Presence | 10 | 16.7 |
| 4A-5 | 920 | Presence | 17 | Presence | Presence | 12 | 16.7 |

LIGHT-EMITTING ELEMENT MOUNTING SUBSTRATE AND LIGHT-EMITTING DEVICE

FIELD OF INVENTION

The present invention relates to a light-emitting element mounting substrate on which a light-emitting element such as an LED is mounted, and a light-emitting device.

BACKGROUND

In recent years, an LED (light-emitting diode) has attracted attention as a light-emitting element which is capable of being mass-produced, and in which power consumption even with high brightness is low. The light-emitting element including the LED has been widely used as a light source for a general lighting apparatus, a light source for a lighting display board, and a backlight of an image display device using liquid crystal such as a cellular phone, a PC, and a television.

For example, Patent Literature 1 discloses an example in which a metal portion formed from Ag, an AgBi-based alloy, or an AgNd-based alloy is provided on a surface side of a substrate main body on which the light-emitting element is mounted, as a substrate on which the light-emitting element is mounted.

CITATION LIST

Patent Literature

Patent Literature 1: Japanese Unexamined Patent Publication JP-A 2010-10279

SUMMARY

Technical Problem

However, the light-emitting element mounting substrate disclosed in Patent Literature 1 has such a problem that bonding strength between the substrate main body and the metal portion is low, and thus the metal portion has a tendency to be peeled off.

The invention has been made to solve the above-described problem, and an object thereof is to provide a light-emitting element mounting substrate in which bonding strength of a reflecting layer is high, and a light-emitting device using the light-emitting element mounting substrate.

Solution to Problem

The invention provides a light-emitting element mounting substrate for mounting a light-emitting element thereon including a substrate main body formed of a ceramic sintered body, and a silver-containing metal portion, a silver-containing region existing in a portion of the substrate main body which faces the metal portion across a bonding portion bonding the substrate main body and the silver-containing metal portion.

In addition, the invention provides a light-emitting device including the light-emitting element mounting substrate; and a light-emitting element mounted on the light-emitting element mounting substrate.

Advantageous Effects of Invention

The light-emitting element mounting substrate of the invention is a light-emitting element mounting substrate for mounting a light-emitting element thereon including a substrate main body formed of a ceramic sintered body, and a silver-containing metal portion, a silver-containing region existing in a portion of the substrate main body which faces the metal portion across a bonding portion bonding the substrate main body and the silver-containing metal portion. Accordingly, the bonding strength between the substrate main body and the metal portion increases.

In the light-emitting device of the invention, a light-emitting element is mounted on the light-emitting element mounting substrate, and thus a light-emitting device with high reliability may be provided.

BRIEF DESCRIPTION OF THE DRAWINGS

FIG. 13 shows a table of results for an experiment described herein.

FIG. 14 shows a table of results for another experiment described herein.

FIG. 15 shows a table of results for another experiment described herein.

DETAILED DESCRIPTION OF THE PREFERRED EMBODIMENTS

A light-emitting element mounting substrate of the embodiment is a light-emitting element mounting substrate for mounting a light-emitting element thereon. As an important configuration, the light-emitting element mounting substrate includes a substrate main body formed of a ceramic sintered body, and a silver-containing metal portion, and a silver-containing region exists in a portion of the substrate main body which faces the metal portion across a bonding portion bonding the substrate main body and the silver-containing metal portion.

As described above, when being formed of a ceramic sintered body, the substrate main body is excellent in mechanical strength and electric insulation properties.

In addition, a silver-containing region exists in a portion of the substrate main body which faces the metal portion across a bonding portion bonding the substrate main body and the silver-containing metal portion, and thus there is a tendency that the bonding strength between the substrate main body and the metal portion increases.

Hereinafter, as an example of an embodiment of the light-emitting element mounting substrate of the invention, an embodiment of a silver-containing metal portion will be described with reference to the attached drawings.

First Embodiment

Figure 1:
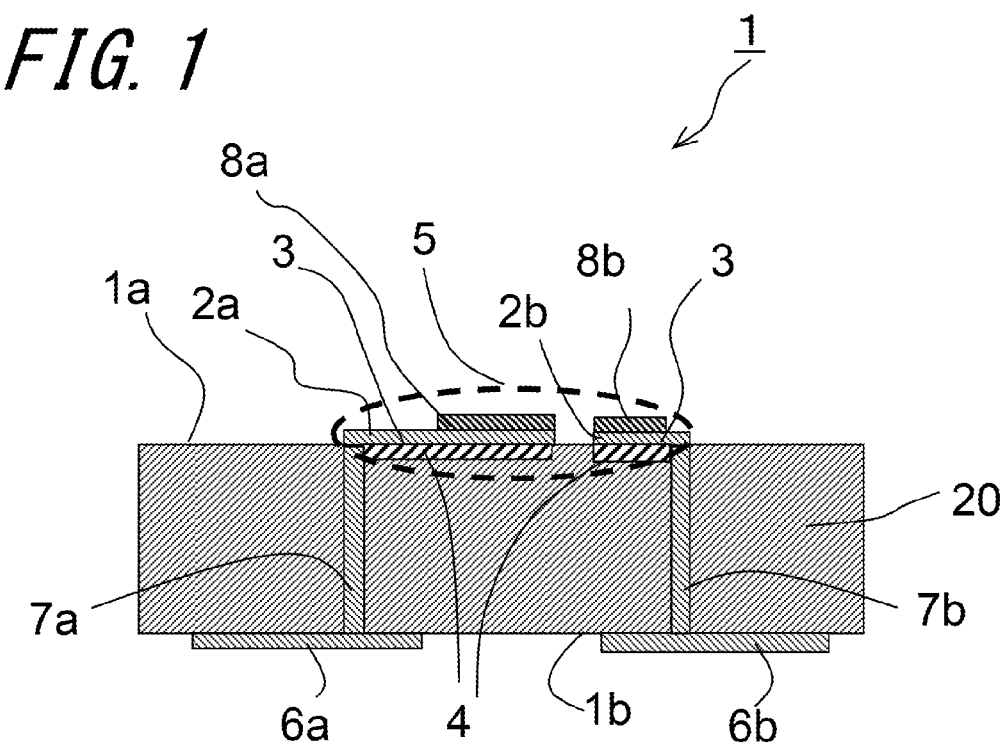
FIG. 1 is a cross-sectional diagram illustrating a configuration of a light-emitting element mounting substrate of the embodiment, in which a metal portion is a first electrode.

FIG. 1 is a cross-sectional diagram illustrating the light-emitting element mounting substrate of a first embodiment.

In FIG. 1, the light-emitting element mounting substrate 1 of the first embodiment includes a substrate main body 20 formed of a ceramic sintered body, and a mounting portion 5 configured to mount a light-emitting element on a first main surface 1a.

The mounting portion 5 is provided with first electrodes 2a and 2b that contain silver, and electrode pads 8a and 8b (hereinafter, may be referred to as simply electrode pads 8) provided on the first electrodes 2a and 2b, and a light-emitting element is mounted on the electrode pad 8a. In addition, in the light-emitting element mounting substrate 1 of the first embodiment, the first electrodes 2a and 2b correspond to a metal portion 2. In addition, the first electrodes 2a and 2b are electrically connected to second electrodes 6a and 6b that are deposited on a second main surface 1b opposite to the first main surface 1a through through-hole electrodes 7a and 7b provided in penetration holes that penetrate through the inside of the substrate main body 20.

In the first embodiment, the first electrodes 2a and 2b are configured to be electrically connected to the second electrodes 6a and 6b, which are deposited on the second main surface 1b opposite to the first main surface 1a, through the through-hole electrodes 7a and 7b that are formed in penetration holes that penetrate through the inside of the substrate main body 20. However, the first electrodes 2a and 2b may be configured to be electrically connected using end faces of the substrate main body 20.

In addition, in the light-emitting element mounting substrate 1, a silver-containing region 4 exists in a portion of the substrate main body 20 which faces the first electrodes across a bonding portion (interface between the substrate main body 20 and the first electrodes 2a and 2b).

When the silver-containing region 4 exists in a portion of the substrate main body 20 which faces the first electrodes 2a and 2b across the bonding portion 3, the bonding strength between the first electrodes 2a and 2b and the substrate main body 20 may be improved, and thus separation of the first electrodes 2a and 2b from the substrate main body 20 may be suppressed.

In addition, when the silver-containing region 4 exists in a portion of the substrate main body 20 which faces the first electrodes 2a and 2b across the bonding portion 3, it is considered that oxidation or sulfurization of the first electrodes 2a and 2b may be suppressed, and thus reflectance may be maintained to be high.

In addition, it is preferable that the first electrodes 2a and 2b are directly formed on the first main surface 1a. When the first electrodes 2a and 2b are directly formed on the first main surface 1a side, the silver-containing region 4 may be easily formed. In addition, when the first electrodes 2a and 2b are directly formed on the substrate main body 20, the number of manufacturing processes may be reduced, and thus the manufacturing cost may be reduced.

Here, for confirmation of the silver-containing region 4, the portion of the substrate main body 20 which faces the first electrodes 2a and 2b that are the metal portions 2 may be cut by laser or the like, the cross-section may be mirror-processed, vapor deposition on the surface may be performed, and then observation may be performed at a 1000 to 2000-fold magnification using a SEM (scanning electron microscope). Furthermore, for confirmation of components of the silver-containing region, WDS analysis may be performed using an EPMA (electron probe microanalyzer) on which a WDS (wavelength-dispersive X-ray spectrometer) is mounted. Hereinafter, with regard to the method of confirming the silver-containing region 4, the same is true of other embodiments.

In addition, the detailed description of the silver-containing region 4 will be described later with reference to FIG. 4.

Second Embodiment

Figure 2:
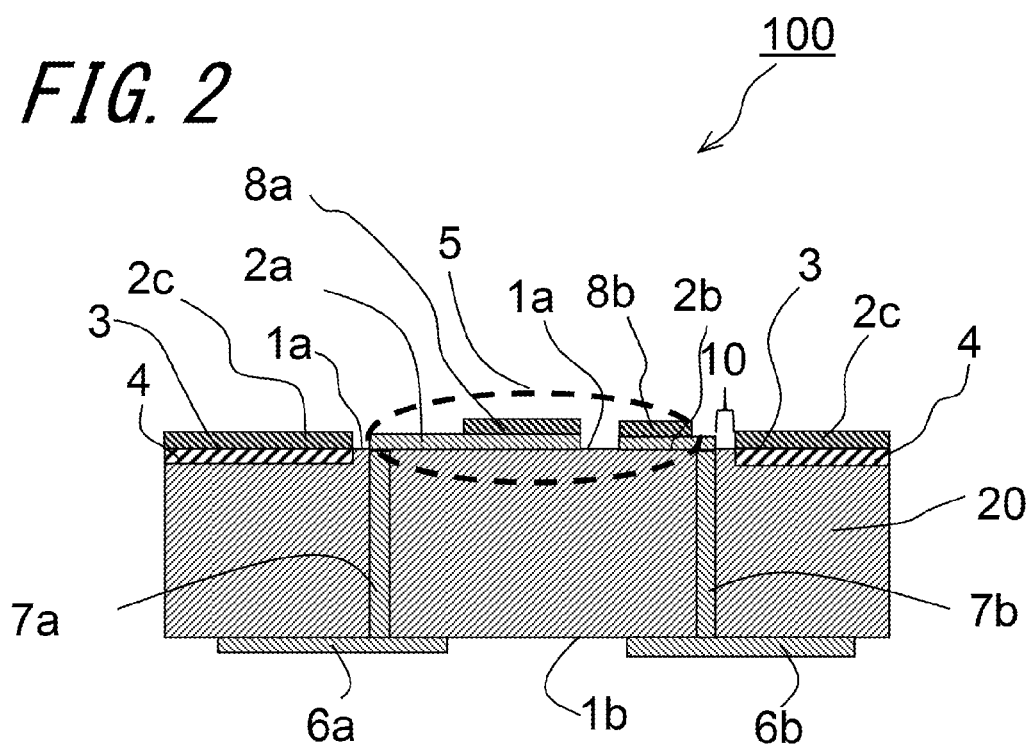
FIG. 2 is a cross-sectional diagram illustrating a configuration of the light-emitting element mounting substrate of the embodiment, in which a metal portion (reflecting layer) not electrically connected to the light-emitting element is provided on a first main surface of a substrate main body.

FIG. 2 is a cross-sectional diagram illustrating a configuration of a light-emitting element mounting substrate of a second embodiment, in which a reflecting layer not electrically connected to a light-emitting element is provided on a first main surface of a substrate main body formed of a ceramic sintered body.

As shown in FIG. 2, the light-emitting element mounting substrate 100 of the second embodiment includes the substrate main body 20 formed of a ceramic sintered body, the mounting portion 5 that is provided on the first main surface 1a to mount the light-emitting element, and a reflecting layer 2c that is not electrically connected to the light-emitting element. In the second embodiment, the reflecting layer 2c corresponds to the metal portion 2.

In addition, the reflecting layer 2c and the mounting portion 5 are disposed with a gap 10 therebetween to maintain insulation properties, and other configurations are the same as the first embodiment, and thus description thereof will be omitted.

In addition, in the second light-emitting element mounting substrate 100, the silver-containing region 4 exists in a portion of the substrate main body 20 which faces the reflecting layer 2c across a bonding portion (interface between the substrate main body 20 and the reflecting layer 2c).

When the silver-containing region 4 exists in a portion of the substrate main body 20 which faces the reflecting layer 2c across the bonding portion 3, the bonding strength between the reflecting layer 2c and the substrate main body 20 may be improved, and thus separation of the reflecting layer 2c from the substrate main body 20 may be suppressed.

In addition, when the silver-containing region 4 exists in a portion of the substrate main body 20 which faces the reflecting layer 2c across the bonding portion 3, it is considered that oxidation or sulfurization of the reflecting layer 2c may be suppressed, and thus reflectance may be maintained to be high.

In addition, in the second embodiment, the silver-containing region 4 may exist in a portion of the substrate main body 20 which faces the first electrodes 2a and 2b across the bonding portion 3. In this case, the metal portion 2 includes the first electrodes 2a and 2b, and the reflecting layer 2c.

Third Embodiment

Figure 3:
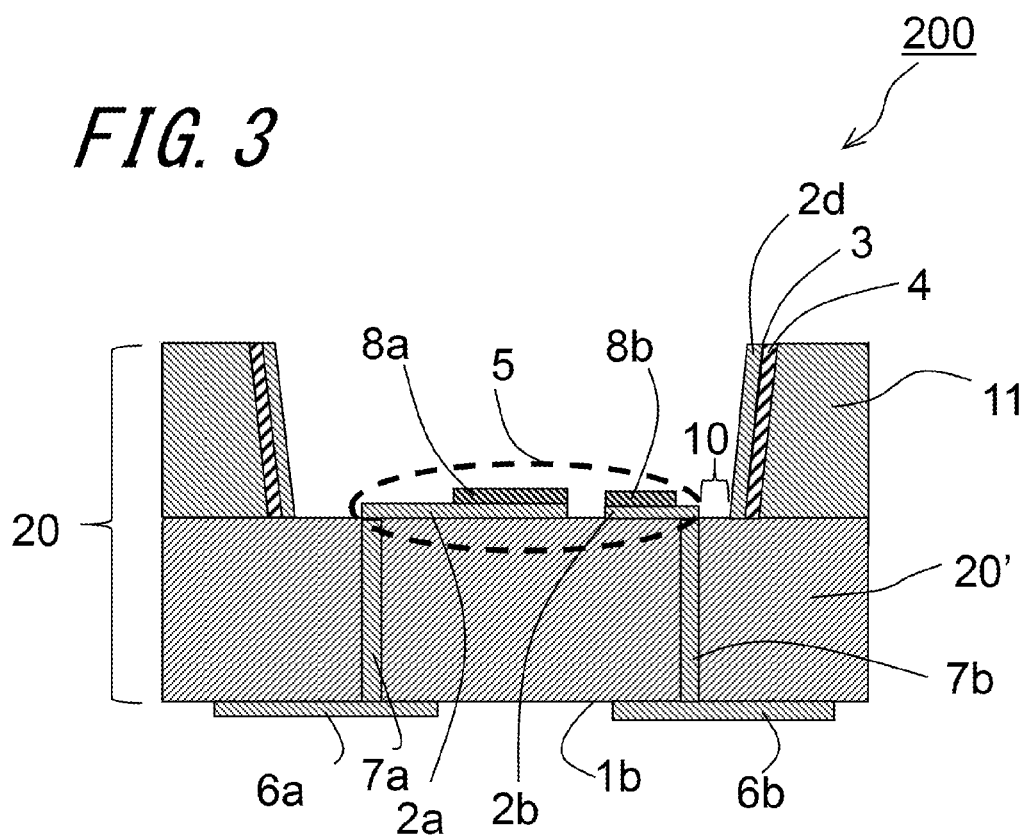
FIG. 3 is a cross-sectional diagram illustrating a configuration of the light-emitting element mounting substrate of the embodiment, in which a metal portion (reflecting layer) not electrically connected to the light-emitting element is provided to a ceramic sintered body disposed on the first main surface of the substrate main body to surround a mounting portion.

FIG. 3 is a cross-sectional diagram illustrating a configuration of a light-emitting element mounting substrate of a third embodiment, in which a silver-containing reflecting layer is provided on an inner circumferential surface of a ceramic sintered body disposed on the first main surface of the substrate main body to surround the mounting portion.

As shown in FIG. 3, in the light-emitting element mounting substrate 200 of the third embodiment, the substrate main body 20 includes a mounting substrate 20' which is formed of a ceramic sintered body, and includes a mounting portion 5 configured to mount the light-emitting element on a surface thereof, and a reflecting member 11 that is disposed to surround the mounting portion 5 and is formed of a ceramic sintered body. A reflecting layer 2d is provided on an inner circumferential surface of the reflecting member 11. In the third embodiment, the reflecting layer 2d corresponds to the metal portion 2. In addition, other configurations are the same as the first embodiment or the second embodiment, and description thereof will be omitted.

The light-emitting element mounting substrate 200 of the third embodiment is provided with the reflecting member 11 which is disposed to surround the mounting portion 5 and has the reflecting layer 2d on the inner circumferential surface thereof. Accordingly, when the light-emitting element is mounted and light is allowed to be emitted, a part of light emitted to a surface of the reflecting layer 2d is reflected toward an opening direction of the reflecting member 11. Here, when the reflecting layer 2d contains silver, high reflectance may be obtained.

In addition, as shown in FIG. 3, the reflecting member 11 is configured in a shape having an inclined surface whose width increases toward an opening direction. However, the reflecting member may have a shape having a surface that is substantially orthogonal to a surface of the mounting portion 5 of the light-emitting element mounting substrate 200. In addition, an external shape of the reflecting member 11 in a plan view from an opening direction side may be a circular shape, a rectangular shape, a rectangular shape having chamfered corners, or a polygonal shape. Furthermore, the reflecting member 11 may be a member integrally formed with the mounting substrate 20', or a member obtained by bonding the mounting substrate 20' to the reflecting member 11.

In addition, with regard to the third light-emitting element mounting substrate 200, in the reflecting member 11 which is disposed to surround the mounting member 5 and is formed of a ceramic sintered body, the silver-containing region 4 exists in a portion of the reflecting member 11 which faces the reflecting layer 2d provided on the inner circumferential surface of the reflecting member 11 across a bonding portion 3 bonding the reflecting member and the reflecting layer.

When the silver-containing region 4 exists in the portion of the reflecting member 11 which faces the reflecting layer 2d across the bonding portion 3, the bonding strength between the reflecting layer 2d and the reflecting member 11 may be improved, and thus separation of the reflecting layer 2d from the reflecting member 11 may be suppressed.

In addition, the silver-containing region 4 exists in the portion of the reflecting member 11 which faces the reflecting layer 2d across the bonding portion 3, it is considered that oxidation or sulfurization of the reflecting layer 2d may be suppressed, and thus reflectance may be maintained to be high.

In addition, in the third embodiment, the silver-containing region 4 may exist in a portion of the substrate main body 20 (mounting substrate 20') which faces the first electrodes 2a and 2b across the bonding portion 3. In addition, although not shown in FIG. 3, the reflecting layer 2c shown in FIG. 2 may be provided on a surface of the mounting substrate 20'. In this case, the metal portion 2 includes the first electrodes 2a and 2b, the reflecting layer 2c, and the reflecting layer 2d.

In addition, in the embodiment, the silver-containing region may be a silver-containing region provided in the substrate main body 20. For example, the silver-containing region may be formed by diffusion of silver from the metal portion 2, or the substrate main body 20 may be prepared using a silver-containing material.

Hereinafter, the respective configurations of the first to third embodiments will be described.

The substrate main body 20 of the first to third embodiments preferably contain magnesium, the metal portion 2 preferably contains silver as a main component and magnesium and bismuth as an accessory component, and the silver-containing region 4 preferably contains silver, magnesium, and bismuth.

The metal portion 2 of the light-emitting element mounting substrates 1, 100, and 200 of the embodiments contains silver as a main component. Accordingly, when the light-emitting element is mounted and light is allowed to be emitted, a part of light is emitted to a surface of the metal portion 2, and is reflected. Here, since the metal portion 2 contains silver as a main component, high reflectance may be obtained. In addition, the main component of the metal portion 2 of the light-emitting element mounting substrates 1, 100, and 200 of the embodiments represents a component occupying 90% by mass or more with respect to 100% by mass of total components of the metal portion 2. In addition, the metal portion 2 and the silver-containing region 4 contain the same components such as silver, magnesium, and bismuth, and thus are strongly bonded to each other. In addition, the substrate main body 20 and the metal portion 2 contain magnesium. Accordingly, in the silver-containing region 4, magnesium contained the substrate main body 20 and magnesium contained in the metal portion 2 have a tendency to aggregate in the vicinity of the bonding portion 3, and the bonding strength has a tendency to increase.

In addition, the silver-containing region in the first to third embodiments may include a first region on a metal portion 2 side thereof and a second region adjacent to the first region. It is preferable that the first region contains more magnesium than the second region, and the second region contains more bismuth than the first region.

Figure 4:
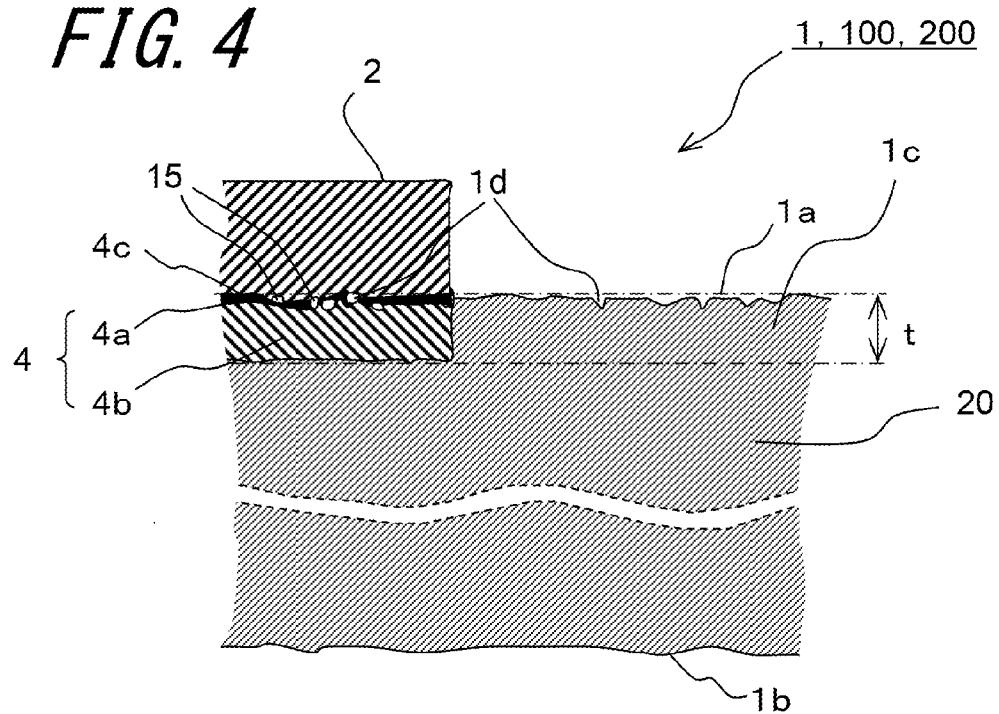
FIG. 4 is a cross-sectional diagram illustrating an example in which a vicinity of the first main surface of the light-emitting element mounting substrate of the embodiment is partially enlarged.

FIG. 4 is a cross-sectional diagram illustrating an example in which a part of the bonding portion between the light-emitting element mounting substrate and the metal portion of the embodiment is partially enlarged.

The silver-containing region 4 of the light-emitting element mounting substrates 1, 100, and 200 of the embodiments as shown in FIG. 4 includes the first region on a metal portion 2 side and the second region adjacent to the first region. The first region contains more magnesium than the second region. The second region is constituted by a second region 4b containing more bismuth than the first region 4a. In addition, pores such as pinholes that exist in a surface 1a of the substrate main bodies 1, 100, and 200 are indicated as concave portions 1d.

Since the silver-containing region 4 of the light-emitting element mounting substrates 1, 100, and 200 of the embodiments includes the first region 4a, which contains more magnesium than the second region, on the metal portion 2 side, the substrate main body 20 and the metal portion 2 containing magnesium are strongly bonded to each other. In addition, since the silver-containing region 4 includes the second region 4b containing more bismuth than the first region, bismuth has a tendency to intrude into the inside 1c of the substrate main body 20 that is a ceramic sintered body in combination with silver, and thus the bonding strength between the substrate main body 20 and the metal portion 2 has a tendency to increase.

In addition, as shown in FIG. 4, the concave portions 1d in the surface 1a of the substrate main body 20 may be filled with silver contained in the metal portion 2, and thus the bonding strength between the substrate main body 20 and the metal portion 2 has a tendency to further increase.

However, generally, in a process of manufacturing the light-emitting element mounting substrates 1, 100, and 200, when a plating treatment is performed with respect to the first electrodes 2a and 2b, the substrate main body 20 on which the first electrodes 2a and 2b are formed is subjected to acid cleaning as a pre-treatment. Here, in the light-emitting element mounting substrates 1, 100, and 200 of the embodiments, since the concave portions 1d are filled with silver, in the acid cleaning process of the substrate 1 including the substrate main body 20, remaining of an acid of the acid cleaning in the concave portions 1d may be suppressed. Accordingly, the progress of corrosion in the metal portion 2, which starts from the concave portions 1d, may be suppressed. As a result, reflectance of the metal portion 2 has a tendency to be maintained to be high.

In addition, with regard to the fact that the silver-containing region 4 contains a large amount of magnesium or bismuth, in an image obtained by performing WDS analysis of the silver-containing region 4 using EPMA, in a case where color intensity of a target portion is higher than that of other portions on the basis of color intensity setting conditions of element mapping, it is determined that the corresponding element is much. For example, in a case where an element detection level of a presence site of the target element is 1.3 or more times those of other sites, it may be determined that a large amount of the element is contained. Furthermore, to confirm silver contained in the metal portion 2 and the silver-containing region 4, or whether or not the concave portions 1d are filled with silver, the silver-containing region 4 may be WDS-analyzed using EPMA (electron probe microanalyzer) on which a WDS (wavelength-dispersive X-ray spectrometer) is mounted.

In addition, the silver-containing region in the first to third embodiments, it is preferable that the thickness t is 5 μm or more and 15 μm or less.

In cases where the thickness t of the silver-containing region 4 of the substrate main body 20 is 5 μm or more, when the substrate main body 20 and the metal portion 2 are bonded with the silver-containing region 4 interposed therebetween, sufficient bonding strength may be secured. In addition, in a case where the thickness t of the silver-containing region 4 is 15 μm or less, bleeding at an end of the metal portion 2, which is caused due to melting of the metal portion 2 when a firing temperature for forming the metal portion 2 is high, may be suppressed.

As described above, when the bleeding at the end of the metal portion 2 is suppressed, for example, as shown in FIGS. 2 and 3, electrical insulation properties between the first electrodes 2a and 2b may be easily secured by the gap 10 between the reflecting layer 2c that is the metal portion 2 and the first and second electrodes 2a and 2b.

In addition, with regard to the silver-containing region 4, for example, in a photograph of an element mapping image which is obtained by cutting a portion of the substrate main body 20 in which the metal portion 2 exists in a thickness direction, and WDS-analyzing the cross-section using the EPMA, a portion in which silver is detected in a scattering level of 5 or more and 20 or less may be set as the silver-containing region 4. In addition, the thickness of the first region 4a may be obtained by measuring a portion in which magnesium aggregates in a scattering level of magnesium of 5 or more and 20 or less. In addition, the thickness of arbitrary plural sites, for example, five sites may be measured, and then an average value of the thickness may be set as the thickness of the regions 4a and 4b to be measured. In addition, the thickness of the second region 4b may be calculated by subtracting the thickness of the first region 4a from the thickness of the silver-containing region 4.

Here, it is preferable that the metal portion 2 contains silver as a main component, and at least magnesium and bismuth as an accessory component. However, in addition to these metals, the metal portion may contain at least one metal among palladium, copper, nickel, strontium, calcium, zirconium, titanium, molybdenum, tin, zinc, and aluminum. However, it is preferable that the content ratio of silver is 97% by mass or more and 99.5% by mass or less so as to make the reflectance of the metal portion 2 high.

In addition, in the metal portion in the first to third embodiments, it is preferable that the total content of magnesium and bismuth is 0.5% by mass to 3.0% by mass.

When the total content of magnesium and bismuth in the metal portion 2 is 0.5% by mass to 3.0% by mass, the thickness t of the silver-containing region 4 has a tendency to be 5 μm or more and 15 μm or less that is the above-described range. Furthermore, when the substrate main body 20 and the metal portion 2 are bonded with the silver-containing region 4 interposed therebetween, sufficient bonding strength may be secured. Furthermore, bleeding at an end of the metal portion 2, which is caused due to melting of the metal portion 2 when a firing temperature for forming the metal portion 2 is high, may be suppressed.

The ceramic sintered body that is used for the substrate main body 20 in the first to third embodiments may be a ceramic sintered body such as an aluminum oxide-based sintered body, a zirconium oxide-based sintered body, and a mullite-based sintered body. In addition, it is preferable that these ceramic sintered bodies contain silicon oxide ($SiO_2$) and magnesium oxide (MgO) as an accessory component.

In addition, from the viewpoints of reflectance, strength, and the like, the aluminum oxide-based sintered body is particularly preferable, and it is preferable to contain aluminum oxide ($Al_2O_3$) as a main component, and silicon oxide and magnesium oxide as an accessory component. In addition, calcium, zirconium, and barium oxides may be contained as the accessory component.

In addition, it is preferable that the substrate main body in the first to third embodiments contains 94% by mass or more and 97% by mass or less of aluminum oxide (Al2O3) as a main component, and contains silicon oxide (SiO2) and magnesium oxide (MgO) as an accessory component.

In a case where the substrate main body 20 contains 94% by mass or more and 97% by mass or less of aluminum oxide as a main component, and contains silicon oxide and magnesium oxide as an accessory component, a used amount of elements such as barium and zirconium whose material cost is high may be reduced. Furthermore, silicon oxide has a function of increasing sintering properties, and magnesium oxide may suppress grain growth of aluminum oxide crystal particles and thus suppresses generation of abnormally large particles. Accordingly, even when firing is performed at a temperature between 1420° C. to 1540° C. that is lower than a common firing temperature, the sintering properties may be sufficiently increased. Accordingly, mechanical strength is high, and cost reduction of the substrate main body 20 may easily realized.

Figure 6:
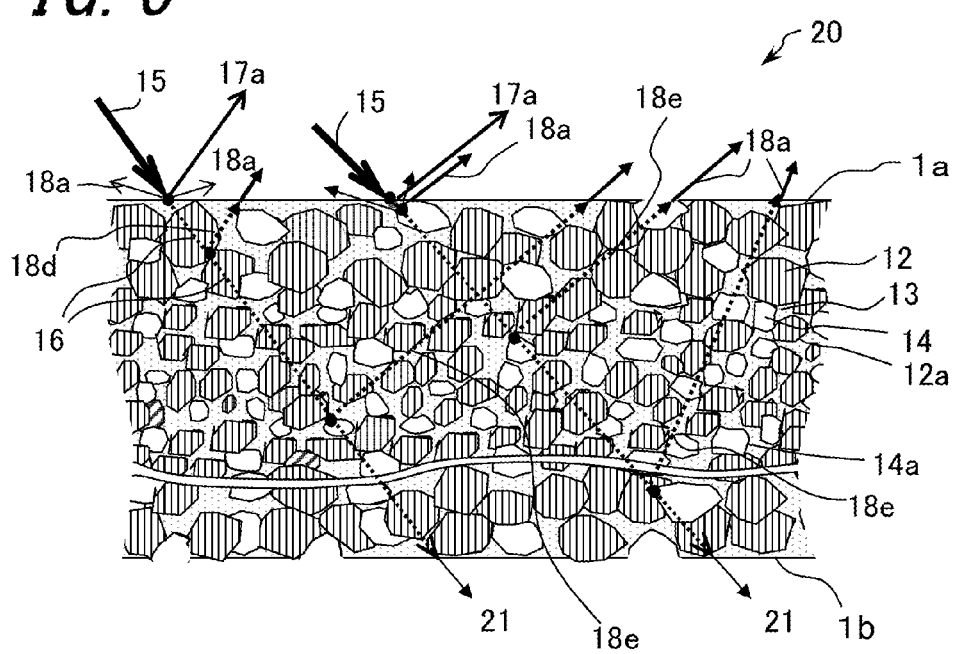
FIG. 6 is a conceptual diagram illustrating a light scattering state of the light-emitting element mounting substrate of the embodiments.

In addition, as shown in FIG. 6 described later, since a glass phase (grain boundary phase) 13 formed of silicon oxide or the like is formed between aluminum oxide crystal particles 12, in a case where a thick film paste for forming the metal portion 2 is applied on the substrate main body 20 and then the resultant thick film is fired, the metal component contained in the paste is transmitted from a main surface through the glass phase 13, and is diffused into the inside 1*c* of the substrate main body 20. Accordingly, the bonding strength between the metal portion 2 and the substrate main body 20 has a tendency to increase.

In addition, in the first to third embodiments, it is preferable that an average particle size of aluminum oxide crystal particles on a surface side of the substrate main body 20 on which the light-emitting element is mounted is 2.0 μm or less.

When the average particle size of aluminum oxide crystal particles on a surface side of the substrate main body 20 on which the light-emitting element is mounted is 2.0 μm or less, a lot of interfaces 14*a* exist in the glass phase 13 in FIG. 6 described later. Accordingly, silver and bismuth have a tendency to intrude into the inside 1*c* of the substrate main body 20 through the glass phase 13, and thus the bonding strength between the metal portion 2 and the substrate main body 20 has a tendency to further increase. In addition, a surface layer side stated here represents a portion on a mounting portion 5 side when the substrate main body 20 is equally divided into three portions in a thickness direction.

In addition, the measurement of the particle size may be obtained as follows. A surface of the substrate 1 is mirror-processed, fire etching is performed in a temperature range lower than a firing temperature of the substrate main body 20 by 50° C. to 100° C., photographing is performed at a 1000 to 3000-fold magnification using a scanning electron microscope (for example, JSM-7001 F manufactured by JEOL Ltd.) to create image data, a particle size of each ceramic particle is obtained using an image analysis apparatus (for example, Win ROOF manufactured by MITANI SHOJI Co., Ltd), and an average value of the particle size is calculated to obtain the particle size. In addition, whether or not the ceramic particle is an aluminum oxide crystal particle may be confirmed by element analysis according to an EDS (energy-dispersive X-ray spectroscopy) method.

In addition, the light-emitting element mounting substrate of the embodiments includes the second electrodes 6*a* and 6*b*, which contain silver and are electrically connected to the first electrodes 2*a* and 2*b* formed on the first main surface by a through-hole electrode, on the second main surface opposite to the first main surface of the substrate main body, and it is preferable that a region (not shown) formed between the substrate main body and the second electrodes 6*a* and 6*b* is set to be less than 1 μm.

Figure 5:
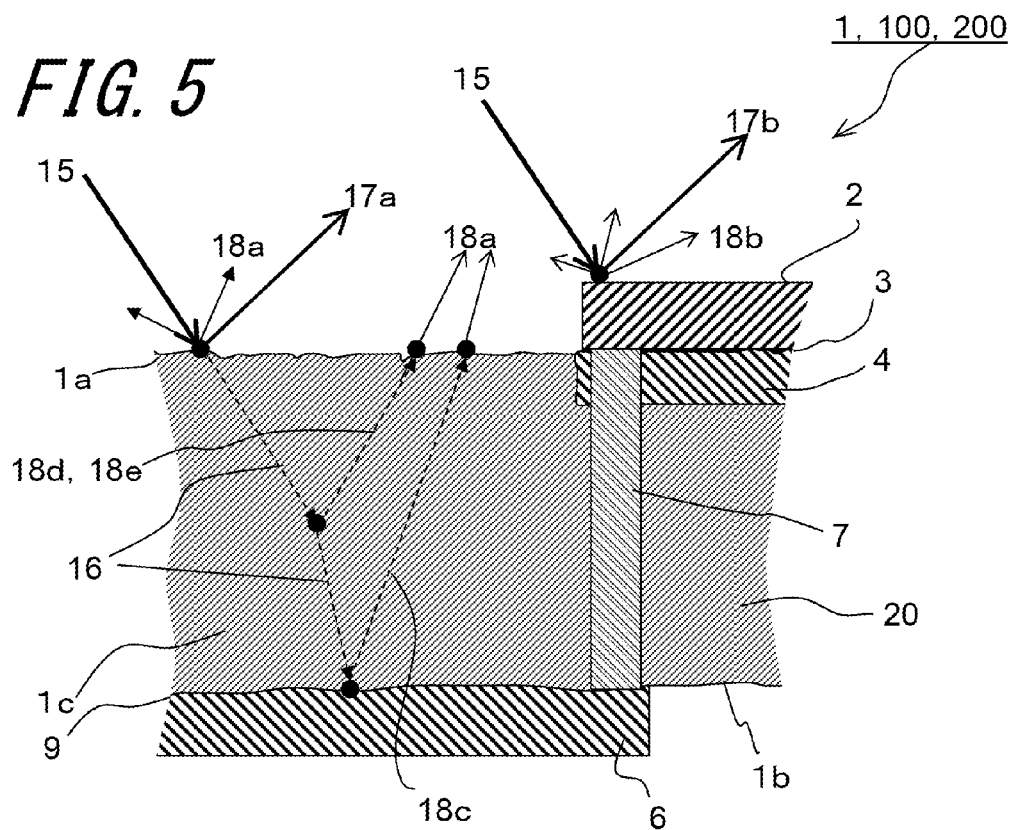
FIG. 5 is a conceptual diagram illustrating a state in which incident light is scattered to the first main surface side of the light-emitting element mounting substrate of the embodiment.

FIG. 5 is a conceptual diagram illustrating a state in which incident light is scattered to the first main surface side of the light-emitting element mounting substrate of the embodiment.

Similarly to the light-emitting element mounting substrates 1, 100, and 200 as shown in FIG. 5, when the second electrodes 6*a* and 6*b*, which are electrically connected to the first electrodes 2*a* and 2*b* formed on the first main surface by a through-hole electrode 7 and contain silver, are provided on the second main surface 1*b* opposite to the first main surface 1*a* of the substrate main body 20 or the mounting member 20', and a silver-containing region (not shown) exists in the bonding portion 3 between the substrate main body 20 and the second electrodes 6*a* and 6*b* in a thickness less than 1 μm, transmitted light 16 has a tendency to be reflected toward the first main surface side 1*a* due to silver particles in the silver-containing region, and thus diffuse reflection light 18*a* that is outputted from the first main surface 1*a* is increased. Accordingly, reflectance of the light-emitting element mounting substrates 1, 100, and 200 has a tendency to increase. However, since the second electrodes 6*a* and 6*b* contain more silver than the silver-containing region and thus reflectance is high, it is preferable that a region (not shown) formed between the substrate main body 20 and the second electrodes 6*a* and 6*b* is set to be less than 1 μm. In addition, it is more preferable that the region is not formed between the substrate main body 20 and the second electrodes 6*a* and 6*b*.

In addition, the thickness of the region that exists on a bonding portion 9 side between the substrate main body 20 and the second electrodes 6*a* and 6*b* may be measured and determined in the same manner as the silver-containing region 4 that exists in a portion facing the first electrodes 2*a* and 2*b* of the substrate main body 20 across the bonding portion 3.

Here, it is preferable that the composition of the second electrodes 6*a* and 6*b* contains silver as a main component, and at least one kind selected from a group consisting of palladium, platinum, zirconium, aluminum, and zinc as an accessory component. When this accessory component is contained, the thickness of the silver-containing region that exists on the bonding portion side between the substrate main body 20 and the second electrodes 6*a* and 6*b* may be set to be less than 1 μm.

FIG. 6 is a conceptual diagram illustrating a light scattering state of the light-emitting element mounting substrate of the embodiments.

As shown in FIG. 6, the substrate main body 20 constituting the light-emitting element mounting substrates 1, 100, and 200 of the embodiments has aluminum oxide crystal particles 12, glass phases (grain boundary phases) 13 formed of silicon oxide or the like, and pores 14 when a cross-section of the substrate main body 20 is viewed in a crystal size level. In addition, in FIG. 6, it is assumed that an interface 12*a* exists between each of the aluminum oxide crystal particles 12 and each of the glass phases 13, an interface 14*a* exists between each of the pores 14 and each of the glass phases 13.

Irradiation light 15 that is emitted to the first main surface 1*a* of the light-emitting element mounting substrates 1, 100, and 200 of the embodiments is outputted as regular reflection light 17*a* that is reflected by the substrate main bodies 1, 100, and 200. In addition, the irradiation light 15 propagates through the inside 1c of the substrate main body 20 as incident light 16, transmits through the second main surface 1b opposite to the first main surface 1a, and is outputted as transmitted light 21.

In addition, parts of the irradiation light 15 become the regular reflection light 17a that is reflected on the first main surface 1a in the opposite direction to and with the same angle as an incidence angle and diffuse reflection light 18 that is reflected on the first main surface 1a in an unspecified direction. However, the remainder of the irradiation light 15 becomes incident light 16 that enters the inside 1c of the substrate main body 20, and transmits through at least one of the aluminum oxide crystal particles 12, the pores 14, and the glass phases 13. In addition, in the substrate, parts of the incident light 16 become diffuse reflection light 18d at the interface 12a between the aluminum oxide crystal particle 12 and the glass phase 13, and diffuse reflection light 18e at the interface 14a between the pore 14 and the glass phase 13, and the remainder further propagates through the inside 1c of the substrate main body 20, generates diffuse reflection light 18e at the interface 13a between the aluminum oxide crystal particle 12 and the glass phase 13, and the interface 14a between the pore 14 and the glass phase 13, and becomes reflected light from the first main surface 1a. In addition, parts of the propagating light become transmitted light 21 that transmit through the second main surface 1b.

In addition, it is preferable that the irradiation light 15 emitted to the first main surface 1a of the substrate main body 20 becomes the regular reflection light 17a and the diffuse reflection light 18a on the first main surface 1a to improve reflectance of light. When the number of pores 14 that exist on a first main surface 1a side is greatly increased compared to the light-emitting element mounting substrate 1 in the related art, and the number of the pores 14 that exist increases as it goes toward a central portion side in the thickness direction, a chance for the incident light 16 to be the diffuse reflection light 18e at the interface 14a between the pore 14 and the glass phase 13 increases, and thus the diffuse reflection light 18 from the first main surface 1a may be increased. Accordingly, the reflection has a tendency to be improved.

Furthermore, with regard to the substrate main body 20 formed of the ceramic sintered body, in a portion of a surface area of 9.074×105 μm2 at a location in the first main surface 1a where the silver-containing region 4 does not exist, it is preferable that, regarding the pores 14 having an equivalent circle diameter of 0.8 μm or more, the porosity is 2.5% to 4.5%, the number of pores is 9,000 to 11,000, and an accumulative relative frequency of the equivalent circle diameter of 1.6 μm or less in pore distribution is 75% or more.

In the substrate main body 20 formed of the ceramic sintered body, when the pores 14 exist under the above-described conditions, irradiation light that is emitted to the ceramic sintered body is effectively reflected by the pores 14, and thus the reflectance of the ceramic sintered body has a tendency to increase. In addition, when the pores 14 exist under the above-described conditions, there is a tendency that the mechanical strength of the ceramic sintered body may be maintained to be high.

In addition, with regard to the substrate main body 20 of the embodiments, the porosity of the pores 14, the number of pores, and the accumulative relative frequency of the equivalent circle diameter of 0.8 μm or more in pore distribution in the portion of the surface area of 9.074×105 μm2 at a location in the first main surface 1a where the silver-containing region 4 does not exist may be digitized using an image analysis device after mirror-polishing the surface of the substrate main body 20 to a depth of 10 μm from the surface, and obtaining an image of a metallurgical microscope at a 100-fold magnification using a CCD camera. For example, as the metallurgical microscope, a microscope (type name: VHX-500) manufactured by KEYENCE CORPORATION may be used, as the CCD camera, digital SIGHT (type name: DS-2Mv) manufactured by Nikon Corporation may be used, as software for image analysis, software (type name: Win ROOF) prepared by MITANI CORPORATION may be used, and each measurement value may be calculated with respect to a surface area of 9.074×105 μm2 with an equivalent circle diameter of 0.8 μm set as a threshold value.

In addition, it is preferable that the substrate main body of the first to third embodiments has a grain boundary phase formed between aluminum oxide crystal particles on a mounting portion 5-side surface of the substrate main body, and an average width of the grain boundary phase is 2 nm or less.

When the substrate main body 20 of the first to third embodiments has the grain boundary phase 13a formed between the aluminum oxide crystal particles 12 on a mounting portion 5-side surface of the substrate main body, and the average width of the grain boundary phase 13a is 2 nm or less, in a case where the incident light 16 enters the grain boundary phase 13a at the inside 1c of the substrate main body 20, reflection of light is repeated between an interface 12b and an interface 12c, and thus the diffuse reflection light 18e increases. As a result, the reflectance has a tendency to increase.

Figure 7:
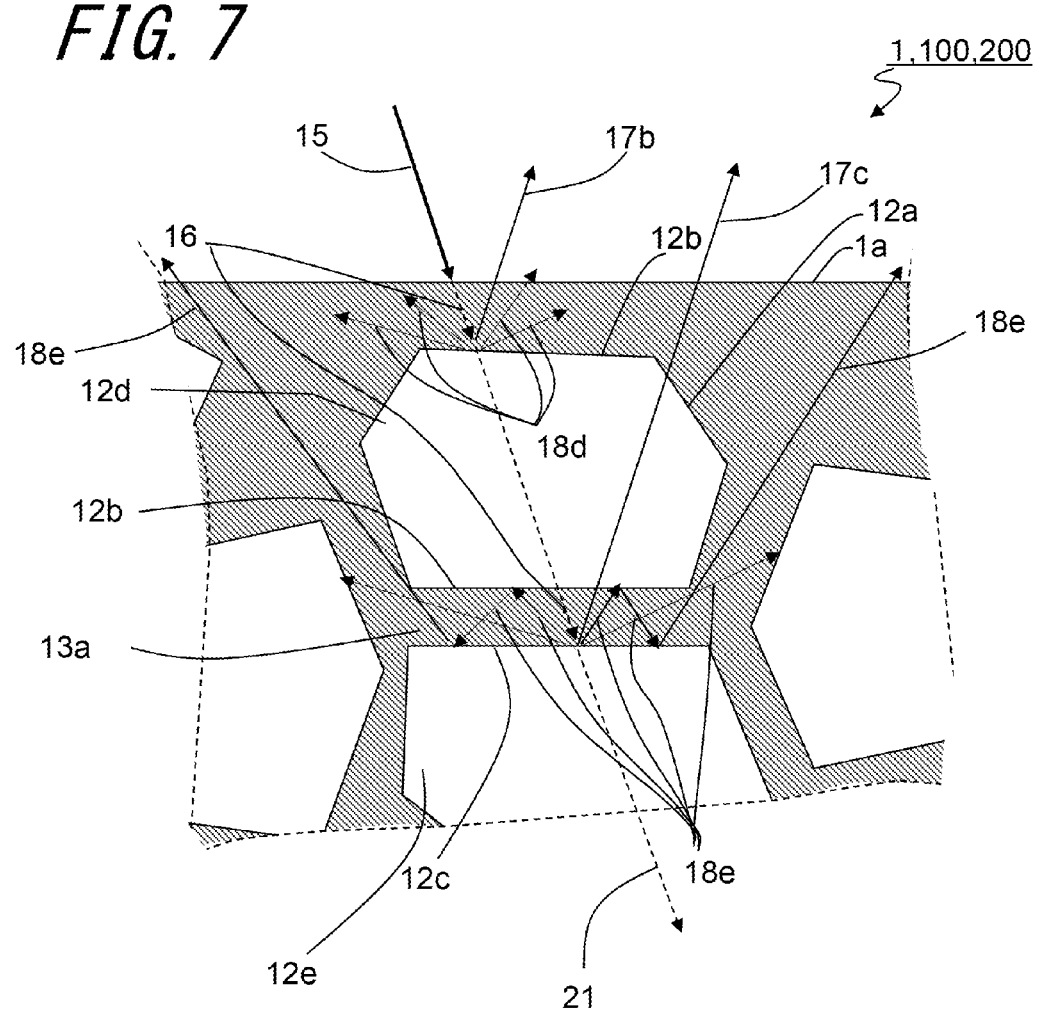
FIG. 7 is a conceptual diagram illustrating a state in which reflected light is scattered between grain boundary phases on a substrate surface side in the light-emitting element mounting substrate of the embodiment.

FIG. 7 is a conceptual diagram illustrating a state in which the diffuse reflection light is scattered between grain boundary phases on a substrate surface side that is a mounting portion 5 side of the substrate main body 20 in the light-emitting element mounting substrate of the embodiments. In addition, description of portions that are common to FIG. 6, and a portion related to the pores 14 will be omitted.

As shown in FIG. 7, with regard to the incident light 16 that propagates from a surface side of the substrate main body 20, that is, a mounting portion 5 side, parts of the incident light 16 become regular reflection light 17b and diffuse reflection light 18d at an interface between the aluminum oxide crystal particle 12 and the grain boundary phase 13a at the inside 1c of the substrate main body 20 on a surface side, and the remaining incident light 16 further propagates through the inside 1c on a surface side of the substrate main body 20, and regular reflection light 17c and diffuse reflection light 18e, which are reflected in the opposite direction to and with the same angle as the incidence angle of the remaining incident light 16 that has propagated, are generated at an interface 12c between next adjacent crystal particle and the grain boundary phase 13a. The diffuse reflection light 18e is repetitively reflected at the grain boundary phase 13a between the interface 12b and the interface 12c, and is outputted from one side surface of the substrate as diffuse reflection light 18e.

In addition, it is preferable that the light-emitting element mounting substrate 1 of the embodiment has a grain boundary phase 13a between aluminum oxide crystal particles, and an average width of the grain boundary phase 13a is 2 nm or less.

In the light-emitting element mounting substrate 1 of the embodiment, when the substrate main body 20 has the grain boundary phase 13a between aluminum oxide crystal particles, and the average width of the grain boundary phase 13a is 2 nm or less (not including 0 nm), for example, in a case of FIG. 7, the grain boundary phase 13a exists between interfaces of the adjacent aluminum oxide crystal particles 12d and 12e. Accordingly, in a case where the incident light 16 enters the grain boundary phase 13a, reflection of light is repeated between the interface 12b and the interface 12c, and the diffuse reflection light 18 increases. As a result, the reflectance has a tendency to increase.

Here, a method of obtaining the average width of the grain boundary phase 13a formed between the aluminum oxide crystal particles is as follows.

Figure 8:
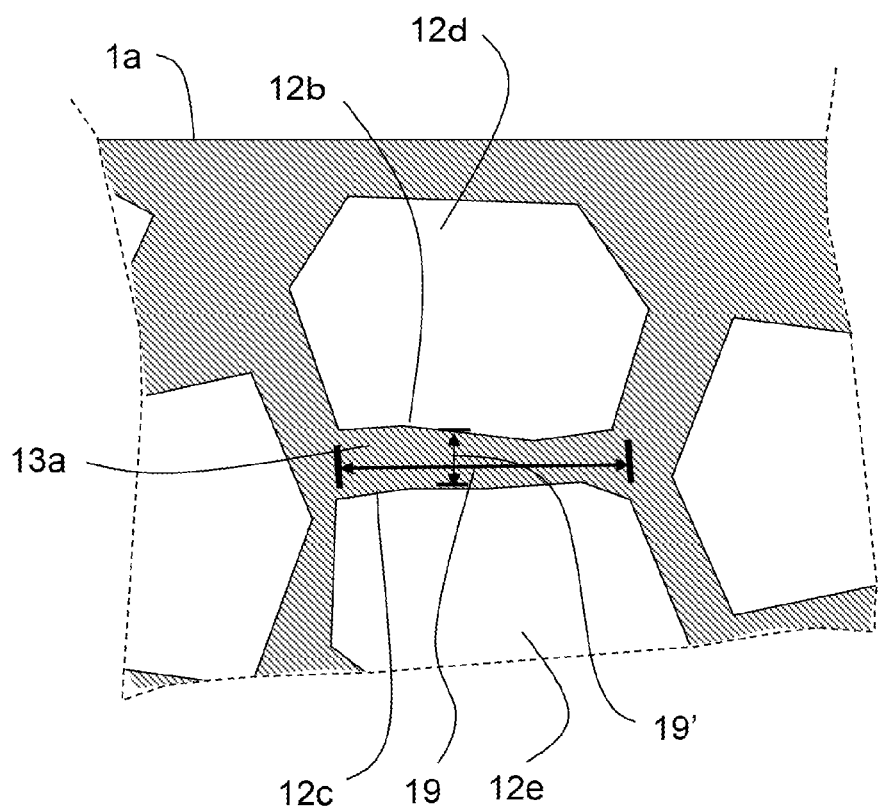
FIG. 8 is a conceptual diagram illustrating an aluminum oxide crystal particle and a grain boundary phase formed between and aluminum oxide crystal particles in the light-emitting element mounting substrate of the embodiment.

FIG. 8 is a conceptual diagram illustrating the aluminum oxide crystal particles 12d and 12e and the grain boundary phase 13a formed between the aluminum oxide crystal particles 12 in the light-emitting element mounting substrate 1 of the embodiment. First, the substrate main body is cut by laser or the like, and the resultant cross-section is mirror-processed. The resultant mirror-processed surface is enlarged at a 40000 to 60000-fold magnification at which the aluminum oxide crystal particle 12 can be observed through TEM observation. Then, within a range (in FIG. 8, within a range in a horizontal direction 19) of the grain boundary phase formed between the crystal particles 12d and 12e, an arbitrary average portion in a width 19' of the grain boundary phase 13a in a vertical direction is measured. This measurement is performed for 10 sites, and the average of the width may be set as an average width of the grain boundary phase 13a.

Next, an example of a method of manufacturing the light-emitting element mounting substrates 1, 100, and 200 of the embodiments will be described.

First, a ceramic sintered body constituting the substrate main body 20 will be described.

For example, in a case where the ceramic sintered body contain aluminum oxide as a main component, powders of aluminum oxide (Al2O3), silicon oxide (SiO2), and magnesium oxide (MgO), which have an average particle size of 1.4 μm to 1.8 μm, are prepared. Then, a mixed powder, which is obtained by weighing the respective powders in such a manner that the total content of the respective powders becomes 100% by mass, is put into a rotary mill together with water, and is mixed using high-purity alumina balls. In addition, calcium oxide (CaO) may be mixed as necessary. In addition, the average width of the grain boundary phase 13 formed between the aluminum oxide crystal particles may be adjusted by adjusting the weighing of a sintering additive.

Here, in a case where the ceramic sintered body contains zirconium oxide as a main component, at least one kind of magnesium oxide and aluminum oxide is selected as the sintering additive, and in a case where the ceramic sintered body contains mullite as a main component, at least one kind of magnesium oxide, silicon oxide, calcium oxide, and yttrium oxide is selected as the sintering additive. In this case, weighing is performed in such a manner that the main component has a content of 90% by mass or more, and the sintering additive becomes the remainder.

Next, at least one kind of binder of polyvinyl alcohol, polyethylene glycol, an acrylic resin, and a butyral resin, is added to the mixture in an amount of approximately 4% by mass to 8% by mass on the basis of total content of 100% by mass of the respective powders, and this resultant mixture is mixed by the rotary mill using high-purity alumina balls to obtain slurry. When an added amount of a binder is within a range of 4% by mass to 8% by mass, the strength and flexibility of a molded body are good, and the binder may be sufficiently degreased during firing.

Next, a sheet is molded using the slurry by a known doctor blade method, or a ceramic sheet is formed according to a roll compaction method by using a granulated body prepared using a spray dryer.

Next, an unfired molded body is prepared using the sheet by processing using a mold for obtaining a product shape or laser processing. At this time, the molded body may be a single item of the substrate main body on which the light-emitting element is ultimately mounted. However, when considering mass productivity, a molded body from which a plurality of items may be obtained is preferable.

In addition, in a configuration in which the substrate main body 20 is provided with the reflecting member 11, in addition to a method of manufacturing a molded body constituting the light-emitting element mounting substrate 200 provided with the reflecting member 11 by preparing the ceramic sheet and laminating the ceramic sheet, a method of integrally forming the reflecting member 11 and the substrate main body 20 by powder press molding may be adapted.

For example, when the reflecting member 11 is formed by preparing the ceramic sheet and laminating the ceramic sheet, an unfired molded body is prepared by a mold or laser processing, and the sheet is bonded to the molded body using the above-described slurry as an adhesive liquid, whereby a molded body constituting the light-emitting element mounting substrate 200 provided with the reflecting member 11 may be prepared.

In addition, a sintered body may be obtained by firing the obtained molded body at an atmospheric (oxidizing) atmosphere using a firing furnace (for example, a roller type tunnel furnace, a batch type atmosphere furnace, and a pusher type tunnel furnace). During the firing, in a case where the main component is aluminum oxide, the highest temperature is set to 1420° C. to 1540° C. In a case where the main component is zirconium oxide, the highest temperature is set to 1350° C. to 1550° C. In a case where the main component is mullite, the highest temperature is set to 1450° C. to 1650° C. In addition, the highest temperature during the firing may be appropriately adjusted by % by mass of the main component.

In addition, in a case where the main component of the molded body is aluminum oxide, the particle size and the average width of the grain boundary phase 13a may be adjusted by further adjusting a firing time.

Next, an example of method of forming the metal portion 2 constituting the first electrodes 2a and 2b, or the reflecting layers 2c and 2d on the substrate main body 20 will be described.

A paste material (hereinafter, referred to as a thick film paste) that forms the metal portion 2 preferably includes a metal powder containing silver as a main component, magnesium, and bismuth, and it is preferable that the content of silver is 97% by mass to 99.5% by mass, and the total content of magnesium and bismuth is 0.5% by mass to 3.0% by mass. In addition, the paste material may contain copper (copper (II) oxide, CuO) as an additional component. In addition, an average particle size of the metal powder may be approximately 0.3 μm to 0.8 μm. In addition, as a binder, for example, ethyl cellulose may be used, and as a solvent, for example, ester alcohol may be used. In addition, when the total content of the metal powder is set to 100% by mass, the ester alcohol may be added in an amount of 15% by mass to 25% by mass.

In addition, here, it is preferable that the content of magnesium and the content of bismuth in the thin film paste are 0.05% by mass to 0.2% by mass, and 0.45% by mass to 2.8% by mass, respectively. When the content of magnesium and the content of bismuth in the thick film paste are 0.05% by mass to 0.2% by mass, and 0.45% by mass to 2.8% by mass, respectively, the thickness of the silver-containing region 4 may be 5 μm more and 15 μm or less.

Deposition of the thick film paste on the substrate main body 20 to form the metal portion 2 may be performed by a known screen printing method or dispenser method. In addition, in the substrate main body 200, when the thin film paste is deposited only on an inner circumferential surface of the reflecting member 11, a nylon screen may be used. In addition, the thick film paste may be deposited in a thickness with which the thickness of the thick film paste after thick film firing becomes approximately 10 μm to 50 μm.

Next, after the deposition of the thick film paste, a drying treatment is performed at 80° C. to 100° C. for approximately one hour, and then firing is performed under conditions in which the highest temperature is 800° C. to 900° C., and a firing time is 0.3 to 1.3 hours to form the metal portion 2.

The thickness t of the silver-containing region may be controlled by the content of magnesium and bismuth. However, when the content is too much, reflectance or strength may be affected by the content. Accordingly, it is preferable that the thickness t of the silver-containing region 4 is made a desired value by limiting the total content and the respective contents within the above-described ranges in combination with adjustment of the firing temperature. When the highest temperature of the firing temperature is lower than 800° C., the thickness t of the silver-containing region 4 is less than 5 μm, and thus the effect of the silver-containing region 4 is less. In addition, when the highest temperature is higher than 900° C., there is a possibility that silver, which is a main component of the metal portion 2, may start to be melted. Accordingly, it is preferable that the highest temperature of the firing is 800° C. to 900° C. In addition, when the firing is performed under the firing conditions, it is considered that the first region 4a containing more magnesium than the second region and the second region 4b containing more bismuth than the first region may be formed from a relationship between the specific gravities and the melting points of the metals.

Next, after the metal portion 2 is prepared, acid cleaning is performed as a pre-treatment for forming plating on the electrode pads 8a and 8b described later. The acid cleaning is performed for degreasing or removal of an oxide film in order for the plating to be strongly deposited on the substrate main body 1. In addition, before the acid cleaning, alkali cleaning may be performed using a caustic soda diluted solution or the like. The reason for performing acid cleaning before plating is that a plating solution has acidity.

In the acid cleaning, hydrochloric acid, nitric acid, or sulfuric acid is used, and immersion is performed in a solution with a concentration of 1% to 20% at an ordinary temperature for approximately one minute. When the concentration of the acid is set to 1% to 20%, degreasing or removal of an oxide on a surface is easy, and silver or the like is less likely to be corroded.

Next, water cleaning or ultrasonic cleaning is performed using pure water or tap water to remove the acid, and then a dry treatment is performed. When the acid remains on a surface of the electrodes, the reflecting layer, the reflecting member, and the substrate, these components may be affected by the acid. Therefore, it is preferable that immersion cleaning in water is performed plural times while changing a cleaning bath, and then water cleaning is performed.

Next, nickel base plating, gold surface plating, and the like are performed on the electrode pads 8a and 8b by a known method.

The light-emitting element mounting substrates 1, 100, and 200 of the embodiments may be prepared by the manufacturing method as described above.

In addition, in the above-described manufacturing method, description has been made with respect to an example in which silver diffusing from the metal portion 2 forms a silver-containing region. However, for example, a region that faces a portion constituting the metal portion 2 is prepared using a silver-containing material, and other regions are prepared using a material not containing silver, and then these are assembled to prepare the substrate main body 20.

Figure 9:
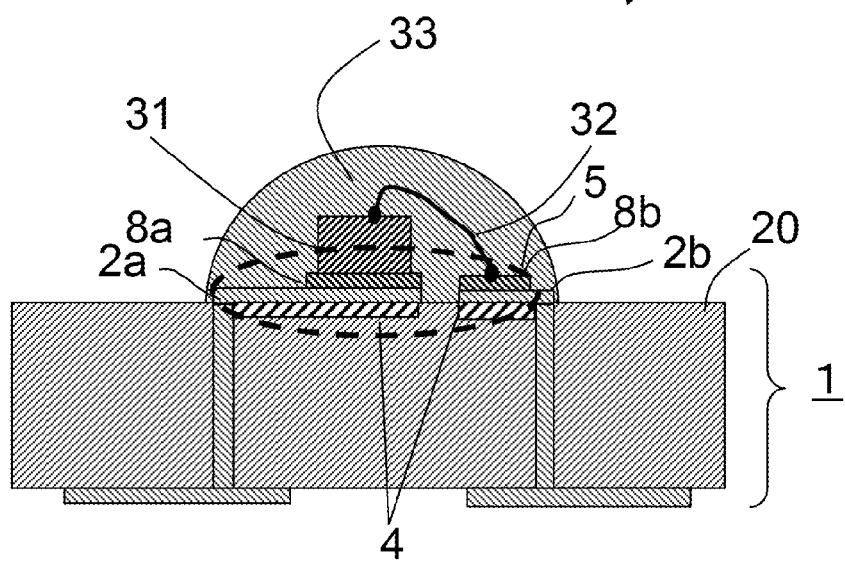
FIG. 9 is a cross-sectional diagram illustrating an example of a configuration of a light-emitting device in which a light-emitting element is mounted on the light-emitting element mounting substrate of the embodiment.

FIG. 9 is a cross-sectional diagram illustrating an example of a configuration of a light-emitting device 30 in which a light-emitting element 31 is mounted in the mounting portion 5 of the light-emitting element mounting substrate 1 of the embodiment.

In the light-emitting device 30 of an example shown in FIG. 9, the light-emitting element 31 is mounted in the mounting portion 5 provided with the electrode pads 8a and 8b and the first electrodes 2a and 2b that are formed on the substrate main body 20 of the light-emitting element mounting substrate 1 of the embodiment. Furthermore, the silver-containing region 4 is formed in a portion of the substrate main body that faces the first electrodes 2a and 2b across the bonding portion. In addition, the electrodes (not shown) of the light-emitting element 31 and the electrode pad 8b are electrically connected by a bonding wire 32.

In addition, here, the electrode pads 8a and the light-emitting element 31 are directly electrically connected. However, bonding by the bonding wire 32 or connection by solder bump (not shown) is also possible.

In addition, the light-emitting element 31, the electrode pads 8a and 8b, and the first electrodes 2a and 2b are covered with a sealing member 33 formed of a resin or the like. The sealing member 33 has both a function of protecting the light-emitting element 31 and a function of lens. In addition, a protective layer may be provided on exposed portions of the electrode pads 8a and 8b, and the first electrodes 2a and 2b using transparent overcoat glass or the like. In this manner, when the light-emitting element 31 is mounted in the mounting portion 5 of the light-emitting element mounting substrate 1 of the embodiment, the light-emitting device 30 may be obtained.

Figure 10:
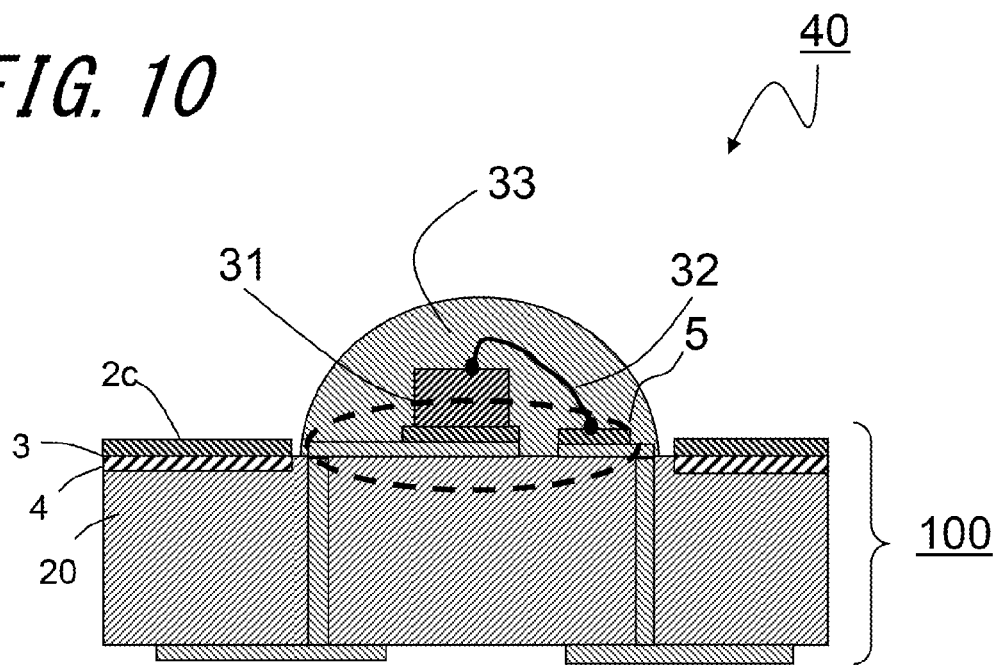
FIG. 10 is a cross-sectional diagram illustrating an example of a configuration of another light-emitting device in which the light-emitting element is mounted on the light-emitting element mounting substrate of the embodiment.

FIG. 10 is a cross-sectional diagram illustrating an example of a configuration of another light-emitting device in which the light-emitting element 31 is mounted on the light-emitting element mounting substrate 100 of the embodiment.

Hereinafter, description will be made while omitting description of portions common to FIG. 9.

In a light-emitting device 40 of an example shown in FIG. 10, the reflecting layer 2c that is not electrically connected to the light-emitting element 31b is provided on the substrate main body 20, and the silver-containing region 4 is provided in a portion facing the reflecting layer 2c across the bonding portion 3. In this manner, when the light-emitting element 31 is mounted in the mounting portion 5 of the light-emitting element mounting substrate 100, the light-emitting device 40 may be obtained. Furthermore, when the mounting portion 5 has the same configuration as FIG. 9, the light-emitting device 40 in which reflectance is high, and bonding strength of the metal portion 2 is high may be realized.

Figure 11:
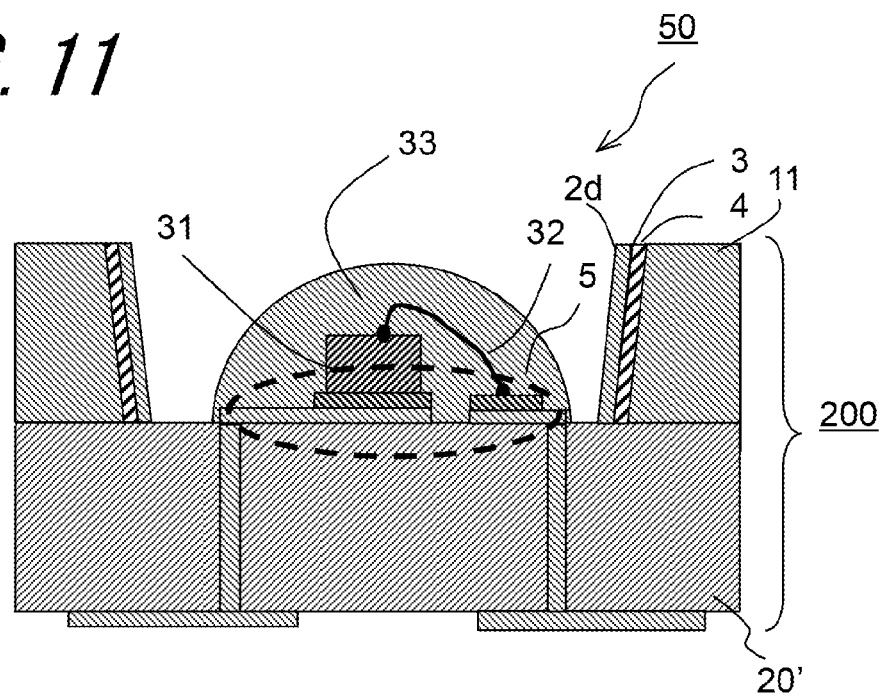
FIG. 11 is a cross-sectional diagram illustrating an example of a configuration of still another light-emitting device in which the light-emitting element is mounted on the light-emitting element mounting substrate of the embodiment.

FIG. 11 is a cross-sectional diagram illustrating an example of a configuration of still another light-emitting device in which the light-emitting element 31 is mounted on the light-emitting element mounting substrate 200 of the embodiment.

Hereinafter, description will be made while omitting description of portions common to FIG. 9.

A light-emitting device 50 of an example shown in FIG. 11 includes the mounting substrate 20' in which the mounting portion 5 for mounting the light-emitting element on a surface thereof is provided, and a reflecting member 11 that is disposed to surround the mounting portion 5. The silver-containing reflecting layer 2d is bonded to the inner circumferential surface of the reflecting member 11, and the silver-containing region 4 is provided in a portion of the substrate main body that faces the reflecting layer 2d across the bonding portion. In this manner, when the light-emitting element 31 is mounted in the mounting portion 5 of the light-emitting element mounting substrate 200 of the embodiment, the light-emitting device 50 may be obtained. Furthermore, when the mounting portion 5 has the same configuration as FIG. 9, the light-emitting device 50 in which reflectance is high, and bonding strength of the metal portion 2 is high may be realized.

Hereinafter, examples of the invention will be described in detail with reference to the configuration of the first embodiment. However, the invention is not limited to the following examples, and the same effect may be obtained in the second and third embodiments of the invention.

Example 1

First, confirmation of an effect as the light-emitting element mounting substrate, in which the substrate main body 20 had the silver-containing region 4 existing in a portion facing the metal portion 2 across the bonding portion, was performed.

First, a sintered body constituting the substrate main body 20 was prepared by the following method.

A powder having an average particle size of 1.6 μm as aluminum oxide (Al2O3), and powders of silicon oxide (SiO2), magnesium oxide (MgO), and calcium oxide (CaO) were prepared. Then, a mixed powder, which was obtained by weighing the respective powders in such a manner that the total content of the respective powders became 100% by mass, was put into a rotary mill together with a solvent such as water, and was mixed therein.

Next, an acrylic resin binder was added to the resultant mixture, and then the mixture was further mixed by rotary mill using high-purity alumina balls to obtain slurry. Here, an added amount of the binder was set to 6% by mass on the basis of 100% by mass of the mixed powder.

Next, the slurry that was obtained was molded in a sheet shape by a known doctor blade method, and the resultant sheet was laser-processed, whereby a molded body having dimensions after firing of a length of 10 mm, a width of 10 mm, and a thickness of 0.635 mm was prepared. In addition, a molded body having dimensions after firing of a length of 30 mm, a width of 10 mm, and a thickness of 0.8 mm was also prepared as a sample to be used to measure mechanical strength.

Next, firing was performed in a pusher type tunnel furnace in an oxidizing atmosphere in the air to sinter the molded body. In the firing, the highest temperature was set to 1530° C., and a firing time was set to 9 hours.

In addition, a zirconia powder containing 3% by mole of yttria was prepared as a stabilizing agent, water was added to this ceramic raw material, and the ceramic raw material was crushed and mixed by a ball mill to prepare slurry. An acrylic resin and polyethylene glycol as a binder were added to the slurry, and a powder was prepared by spray drier. Then, a molded body having the same dimensions after firing as the embodiment was obtained by powder press molding using the powder. Then, the molded body was dried in a dryer. Then, the same firing conditions and firing furnace as the embodiment were used except that the highest temperature of the firing was set to 1450° C., whereby a sintered body was obtained. In the sintered body that was obtained, an average particle size of zirconium oxide (ZrO2) was 0.4 μm. The sintered body had a composition containing 91.3% by mass of zirconium oxide (ZrO2), 5.5% by mass of yttrium oxide (Y2O3), and 1.0% by mass of aluminum oxide (Al2O3), the remainder being 2.0% by mass of hafnium oxide (HfO2) and 0.2% by mass of iron oxide (Fe2O3) as unavoidable impurities.

Furthermore, the metal portion 2 was formed on the first main surface 1a of the substrate main body 20. First, as thick film paste for forming the metal portion 2, thick film paste (product name: NP-4301 L) manufactured by Noritake Co., Limited was used. Main constituents of the paste component include 99% by mass of silver, 0.1% by mass of magnesium, 0.5% by mass of bismuth, and 0.3% by mass of copper. In addition, other components were contained in an amount of 0.1% by mass. An average particle size of a metal powder was 0.4 μm. In addition, as a binder, ethyl cellulose and a mixed solvent were added in an amount of 17.6% by mass on the basis of total content of 100% by mass of the metal powder. Hereinafter, the paste is referred to as paste A.

In addition, with regard to samples of comparative examples, Sample Nos. 101 and 102 were used as the substrate main body 20, and as the thick film paste for forming the metal portion 2, pressure membrane paste (product name: MH-1063) manufactured by Tanaka Kikinzoku Kogyo K.K. was used. This thick film paste contained 98% by mass of silver and metals such as boron, zirconium, aluminum, and zinc as other components. An average particle size of the metal powder was 0.4 μm. As a binder, solvents such as ethyl cellulose and ester alcohol were added in an amount of approximately 15% by mass on the basis of total content of 100% by mass of the metal powder. Hereinafter, this paste is referred to as paste B.

In addition, a stainless steel screen was mounted on the first main surface 1a of the substrate main body 20, and the thick film paste was printed by moving squeegee, whereby a metal film having dimensions of 10 mm square, and an average thickness of 10.5 μm after firing was formed.

Next, the substrate on which the metal film was formed was subjected to a drying treatment at a temperature of 80° C. for one hour.

In addition, thick film firing was performed in an atmospheric atmosphere using a thick film drying and firing furnace (type name: TEM-0608 S) manufactured by YAMAZAKI DENKI Colo., LTD. In the thick film firing, the highest temperature was set to 840° C. From the thick film firing, samples shown in Table 1 were prepared. In addition, a firing time of IN-OUT was set to one hour. The thick film paste, which was used, was distinguished using symbols A and B that are appended to Samples Nos. 101 and 102.

Next, acid cleaning of the samples was performed by the same method as the acid treatment before the plating treatment of the light-emitting element mounting substrate. In addition, the number of samples was total 25.

First, as a solution for the acid cleaning, a solution with a nitric acid concentration of 1% was prepared using dilute nitric acid (67.5%) (product name) produced by Takasugi Pharmaceutical Co., Ltd. and ion-exchanged water. Here, since the metal portion 2 containing silver as a main component was bonded as a thick film, the concentration of the nitric acid was 1% in order for the metal portion 2 to be affected by the acid cleaning to the minimum.

Next, each sample was immersed in the nitric acid solution that was prepared at an ordinary temperature for approximately one minute.

Next, the sample was immersed in a primary cleaning bath and a secondary cleaning bath in this order so as to clean the acid that was attached to the sample, and finally, shower water cleaning was performed. Next, the sample was dried at a temperature of approximately 80° C. for approximately 30 minutes. In addition, in each cleaning, ion-exchanged water was used.

Next, an analysis method and a test method with respect to the samples of the embodiment and comparative examples will be described.

First, with regard to measurement of reflectance of light in the substrate main body 20, as a measuring device (not shown), a spectrophotometer (type name: UV-315) and an integrating sphere unit (type name: ISR-3100) manufactured by Shimadzu Corporation were used. As a light source, a 50 W halogen lamp and a heavy hydrogen lamp were used. A wavelength range was set to 200 nm to 1000 nm. A measurement range was set to a diffuse reflectance (7×9 mm with a slit of 20 nm), a filter and a mask were not used, and measurement was performed using a barium sulfate powder as a reference of the reflectance. In addition, with regard to the number of measurement samples, the measurement was performed with respect to one site of the first main surface 1a of each 10 samples in which the thickness of the substrate main body 20 was 0.635 mm, and an average value when the wavelength was 500 nm was used as data.

Next, with respect to a cross-section of the sample, in which the metal portion 2 was formed, on a first main surface 1a side, the situation of the silver-containing region 4 was analyzed. An arbitrary site of the substrate main body 20 in which the metal portion 2 was formed was cut by laser, and the resultant cross-section was mirror-processed. The resultant polished surface was observed by a metallurgical microscope at a 1000-fold magnification, it was determined whether or not the silver-containing region 4, the first region 4a, and the second region 4b existed, and the thickness t was measured.

Here, with regard to whether or not the silver-containing region 4 existed, a case in which the thickness t was 0.1 μm or more was determined as "Presence". A case in which the thickness t was less than 0.1 μm was assumed as a case in which the silver-containing region 4 did not substantially exist, and was determined as "Absence".

In addition, with respect to the regions 4a and 4b prepared by carbon deposition in advance, component analysis of an area of 66 μm square was performed by WDS analysis using a scanning electron microscope (type name: JXA-8100) manufactured by JEOL Ltd. From this analysis, it was confirmed that the first region 4a contained much magnesium, and the second region 4b contained much bismuth. In addition, the number of samples was set to 10, and an average value thereof was used as data.

Next, the reflectance of the metal portion 2 was measured. A measurement method was the same as the method of measuring the reflectance of the substrate main body 20 described above. The number of samples was set to 10, and an average value thereof was used as data.

Next, a method of measuring the bonding strength of the metal portion 2 will be described.

Figure 12:
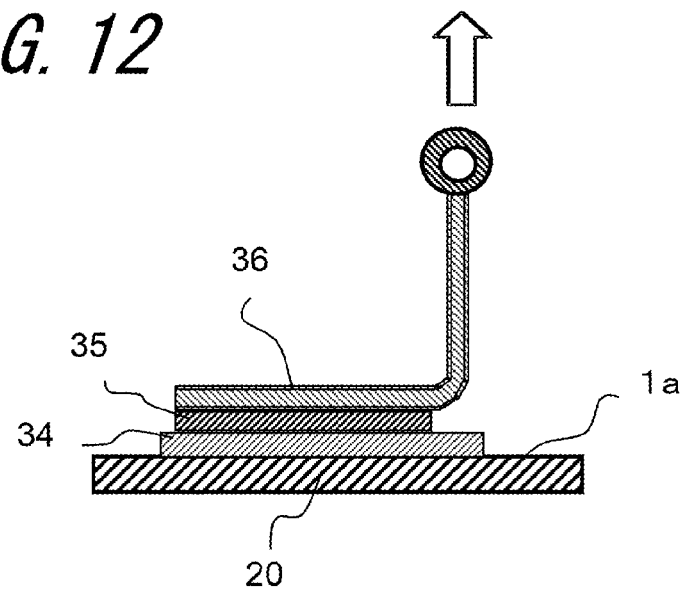
FIG. 12 is a cross-sectional diagram illustrating a method of measuring bonding strength with respect to a metal portion that is deposited on a surface of the substrate main body of the embodiment.

FIG. 12 is a cross-section diagram illustrating the method of measuring the bonding strength with respect to a conductor 34 deposited on a surface of the substrate main body 20 of the embodiment.

First, as preparation for measuring the bonding strength, solder 34 containing 2% by mass of Ag on the basis of the entirety of Sn—Pb (6:4 solder) based solder was selected, flux (trade name: XA-100) manufactured by TAMURA KAKEN CORPORATION, which was obtained by mixing ketone and an alcohol-based solvent with a rosin-based synthetic resin, was selected, and a plated conducting wire (Sn-plated copper wire) 35 having a diameter of 0.6 mm was soldered to a surface of the conductor 34 (metal portion 2) at a temperature of 225 5° C.

Next, the plate conducting wire 35 was pulled at a speed of 7.62 mm/minute, and strength when the conductor 34 was separated from the substrate main body 20 was measured. This strength was set to the bonding strength of the conductor with respect to the substrate main body 20. As a test device, Die Shear Tester (type name: 520 D) manufactured by ANZA TECHNOLOGY, INC. was used. The measurement was performed for each 10 samples, and an average value was obtained. In a case where a plated conducting wire 36 was peeled from the conductor 34, this case was excluded from data, and data when the conductor 34 was peeled from the substrate main body 20 was set as the bonding strength of the conductor 34.

The measurement of the bonding strength of the conductor 34 (metal portion 2) was performed with respect to a case before performing a test of exposing the sample to constant-temperature and high-humidity, and a case after performing tests of exposing the sample to constant-temperature and high-humidity for 150 hours, 500 hours, and 1000 hours, respectively. As a sample, a sample in which the same thick film as the case of measuring the bonding strength was formed with dimensions of a length and a width of 10 mm square on the entire surface of the same substrate main body 20 as the sample for measurement of the bonding strength were used. With regard to test conditions, a temperature was set to 85° C., humidity was set to 85%, an atmosphere was set to the atmospheric atmosphere, and a no-load test in which electricity is not supplied to an electrode was performed. In addition, with respect to the measurement tests after each exposure time, measurement of the reflectance was performed repetitively for the same sample. However, since measurement of the bonding strength was a destructive test, this measurement was performed for the same group. An average value of 10 samples was used as data.

Results that were obtained are shown in FIG. 13.

From FIG. 13, it could be understood that Sample Nos. 101A and 102A in which the silver-containing region 4 existed in the first main surface 1a with the bonding portion 3 interposed between the silver-containing region 4 and the metal portion 2 was capable of maintaining higher reflectance compared to Sample Nos. 101B and 102B in which the respective same main components are contained and the silver-containing region 4 did not exist. In addition, it could be understood that Sample Nos. 101A and 102A had higher bonding strength and were capable of maintaining the bonding strength over a longer period of time compared to Sample Nos. 101B and 102B having the respective same main components.

With regard to the reflectance of light in a state in which the metal portion 2 was not formed on the main surface of the substrate 1, Sample Nos. 101A in which the substrate main body 20 was formed of aluminum oxide had a reflectance of 92% or more at a wavelength of 500 nm, and this result was better than that of Sample No. 102A in which the substrate main body 20 was formed of zirconium oxide.

Example 2

Next, a sintered body was prepared by changing the composition of the substrate main body 20 and the firing temperature, and the metal portion 2 was formed on the sintered body that was obtained. Then, examination was performed for the effect on the bonding strength and the reflectance of the light-emitting element mounting substrate in which the silver-containing region 4 existed in a portion of the substrate main body 20 which faces the metal portion 2 across the bonding portion.

The sintered body constituting the substrate main body 20 of the embodiment was prepared by the same method as Example 1. However, the content of aluminum oxide (Al2O3) was set to a range of 93.5% by mass to 97.5% by mass, and an amount of silicon oxide (SiO2), an amount of magnesium oxide (MgO), and an amount of calcium oxide (CaO) were changed, respectively. In addition, the highest temperature was set to 1400° C. to 1550° C., and the firing time was set to 6 to 9 hours. Sample Nos. 1 to 10 shown in Table 2 were prepared under these conditions. Dimensions of the sintered body were the same as Example 1.

Furthermore, the metal portion 2 was formed by the same method as Example 1 using the substrate main body 20. As thick film printing paste, the paste A was used. However, the highest temperature of the thick film firing was set to 840° C., and the IN-OUT time was set to one hour. The metal portion 2 (conductor 34) was formed under these conditions.

Next, an analysis method and a test method with respect to the samples of the embodiment will be described.

The measurement of the reflectance of each light-emitting element mounting substrate was performed by the same method as the measurement method of Example 1.

In addition, the measurement of mechanical strength was performed according to JIS R 1601. In the measurement, a sintered body that was prepared in advance and had a length of 30 mm, a width of 10 mm, and a thickness of 0.8 mm was used, and a load of 0.5 mm/minute was applied to the central portion with a span of 20 mm of the sintered body. The maximum load before the sintered body was broken was measured, and three-point bending strength was calculated. In addition, the measurement was performed with respect to 10 samples, and an average value thereof was obtained.

Next, an analysis method and a test method with respect to the first electrodes 2a and 2b formed on the first main surface 1a of the substrate main body 20 will be described. As a sample for the analysis and test, a sample in which the conductor 34 of 10 mm square was formed on the substrate main body 20 was used as the metal portion 2.

In addition, measurement on each of situation of the silver-containing region 4, the bonding strength, and the reflectance of the sample in which the metal portion 2 was formed was performed by the same method as Example 1.

Next, the measurement of reflectance and the bonding strength of the metal portion 2 (conductor 34) was performed with respect to an initial value before performing a test of exposing the sample to constant-temperature and high-humidity, and a case after performing tests of exposing the sample to constant-temperature and high-humidity for 150 hours, 500 hours, and 1,000 hours, respectively. The test of exposing the sample to constant-temperature and high-humidity, and the method of measuring the bonding strength and the reflectance were the same as Example 1.

Results that were obtained are shown in Table 2 and FIG. 14.

TABLE 2

| Sample No. | Component content of Substrate main body | | | | Firing temperature (° C.) | Firing time (Time) | Bending strength (MPa) | Reflectance of Substrate (%) |
|---|---|---|---|---|---|---|---|---|
| | $Al_2O_3$ (% by mass) | $SiO_2$ (% by mass) | MgO (% by mass) | CaO (% by mass) | | | | |
| 1 | 93.50 | 3.50 | 2.40 | 0.60 | 1530 | 9.0 | 305 | 85.8 |
| 2 | 94.00 | 3.75 | 2.25 | 0.00 | 1450 | 9.0 | 312 | 91.3 |
| 3 | 94.00 | 3.00 | 2.40 | 0.60 | 1500 | 6.0 | 338 | 91.1 |
| 4 | 96.00 | 2.50 | 1.20 | 0.30 | 1530 | 9.0 | 355 | 92.4 |
| 5 | 96.00 | 2.50 | 1.20 | 0.30 | 1550 | 9.0 | 360 | 85.4 |
| 6 | 96.00 | 2.50 | 1.20 | 0.30 | 1420 | 9.0 | 310 | 92.9 |
| 7 | 96.00 | 2.50 | 1.20 | 0.30 | 1400 | 8.0 | 302 | 93.1 |
| 8 | 97.00 | 1.87 | 1.13 | 0.00 | 1530 | 9.0 | 318 | 91.7 |
| 9 | 97.50 | 0.50 | 1.60 | 0.40 | 1530 | 9.0 | 305 | 93.0 |
| 10 | 95.00 | 2.75 | 1.80 | 0.45 | 1530 | 9.0 | 342 | 91.1 |

From Table 3, it could be understood that Sample Nos. 1A to 10A in which the silver-containing region 4 existed in a portion of the first main surface 1a which faces the metal portion 2 across the bonding portion was capable of maintaining higher reflectance of the substrate 1 compared to Sample Nos. 1B to 10B in which the silver-containing region 4 did not exist. In addition, it could be understood that Sample Nos. 1A and 10A had higher bonding strength and were capable of maintaining the reflectance of the substrate 1 to be relatively higher compared to Sample Nos. 1B to 10B.

Furthermore, when comparing Sample Nos. 1, 4, and 8 to 10 in which the firing temperature and the firing time were the same, it could be understood that since Sample Nos. 4, 8, and 10 in which the content of aluminum oxide (Al2O3) as a main component was 94% by mass or more and 97% by mass or less had higher bending strength compared to Sample Nos. 1 and 9 in which the content of aluminum oxide (Al2O3) as a main component was not 94% by mass to 97% by mass, even when firing was performed at a temperature lower than a common firing temperature, the mechanical strength of the Sample Nos. 4, 8, and 10 was sufficiently high.

Example 3

Next, examination was performed with respect to a preferred range of the thickness t of the silver-containing region 4.

The metal portion 2 was formed on the main surface 1a of the substrate main body 20 by using the same substrate main body 20 and thick film paste as Sample No. 4A of Example 2 and by changing the thick film firing temperature from 780° C. to 920° C. The thick film firing time was set to one hour, and the thickness after firing of the metal portion 2 was set to 10.5 µm.

A method of measuring the thickness of the silver-containing region 4 and the bonding strength of the metal portion was the same as Examples 1 and 2. In addition, the number of samples was set to 10, and an average value thereof was used as data.

In addition, linearity of a pattern (not shown) was also measured for reference. With respect to a sample in which the metal portion 2 of 10 mm square was formed, the linearity of an arbitrary linear portion of 8 mm of the pattern was measured at a 200-fold magnification using a tool maker's microscope, and an average value of each 10 samples was used as data.

Examination results are shown in FIG. 15.

As can be seen from FIG. 15, in Sample Nos. 4A, and 4A-2 to 4A-4 in which the thickness t of the silver-containing region 4 was 5 µm or more and 15 µm or less, the bonding strength of the metal portion 2 shown is a value as high as 10 MPa or more. In addition, the linearity of the pattern of the metal portion 2 was 10 µm or less, and thus it could be understood that insulation properties may be maintained to be high. In addition, similarly to Sample Nos. 2 and 3 of the embodiment, in Sample No. 4A-5, in a case where the gap 10 is formed to maintain the insulation properties between the reflecting layer 2c and the mounting portion 5, a numerical value of the linearity of the metal portion increases, and thus it is less likely to maintain electrical insulation properties.

In addition, although not described in FIG. 15, a magnesium component was less detected in the second region 4b. In consideration of this point, it can be seen that the first region 4a containing a large amount of magnesium was formed in the vicinity of the interface 4c in combination of magnesium contained in the metal portion 2 and magnesium contained in the substrate main body 20. On the other hand, it is considered that bismuth contained in the second region 4b is formed by bismuth contained in the metal portion 2.

Example 4

Next, examination was performed with respect to a case in which a silver-containing region existed in the substrate main body 20 in a thickness less than 1 µm with the bonding portion interposed between the second electrodes 6a and 6b and the silver-containing region.

As a sintered body, the same sample as Sample No. 4 having a thickness of 0.635 mm was used, the first electrodes 2a and 2b were not formed on the first main surface 1a, and the second electrodes 6a and 6b were formed only on the second main surface 1b.

The second electrodes 6a and 6b were obtained as follows. Thick film printing was performed using the thick film paste A and the thick film paste B to have dimensions after thick film firing of a thickness of 10.5 µm with 10 mm square, and then thick film firing was performed. In the thin film firing, the highest temperature was set to 840° C., and the IN-OUT time was set to one hour.

In addition, examination was also performed with respect to whether or not the silver-containing region existed in a surface layer portion of the main surface 1b on which the second electrodes 6a and 6b were formed. The examination method was the same as the method described in Example 1.

The measurement of the reflectance was performed as follows. Light was emitted to the first main surface 1a side opposite to the second main surface 1b on which the second electrodes 6a and 6b were formed, and reflected light (regular reflection light 17 and diffuse reflection light 18) of the light was measured. A method of measuring the reflected light was the same as the method of Example 1. The number of measured samples was set to 10, and an average value thereof was used as data.

TABLE 5

| | | Region | |
|---|---|---|---|
| Sample No. | Presence or Absence | Thickness of Region (µm) | Reflectance of Substrate (%) |
| 11A | Presence | 11 | 92.8 |
| 11B | Absence | — | 93.7 |

In Sample No. 11A shown in Table 5, the silver-containing region was confirmed to exist across the bonding portion of the main surface 1b on which the second electrode 6a and 6b were formed, and the reflectance on the main surface 1a side was 92.8%. Conversely, in Sample No. 11B in which the silver-containing region did not substantially exist, the reflectance was as relatively high as 93.7%. The sintered body was the same as Sample No. 4 used in Example 2, and the reflectance when the electrodes were not formed was 92.4%. Accordingly, it can be understood that the reflectance toward the main surface 1a side due to the electrodes on a surface (second main surface 1b) opposite to the light irradiation side increases by approximately 0.4% or more, and in a case where the silver-containing region 4 does not substantially exist, the reflectance increases by approximately 1.3%.

Example 5

Next, confirmation of a variation in the thickness of the silver-containing region 4 due to variation in the content of magnesium and bismuth contained in the metal portion 2 was performed.

The same substrate main body 20 as Sample No. 4A of Example 2 was used, thick film paste that was adjusted to have the content of magnesium and bismuth shown in Table 6 was used, and a thick film firing temperature was set to 840° C. Under these conditions, the metal portion 2 was formed on the first main surface 1a of the substrate main body 20. The thick film firing time was set to one hour, and the thickness after firing of the metal portion 2 was set to 10.5 µm.

The content of magnesium and bismuth in the metal portion 2 was obtained as % by mass of each component by analyzing the surface of the metal portion 2 according to X-ray fluorescence analysis (XRF). In addition, the number of samples was set to 10, and an average value thereof was used as data. In addition, measurement of the linearity was the same as Example 3.

Examination results that were obtained are shown in Table 6.

TABLE 6

| Sample No. | Magnesium (% by mass) | Bismuth (% by mass) | Total (% by mass) | Thickness of Region (µm) | Linearity of Pattern (µm) | Bonding strength of Metal portion (MPa) |
|---|---|---|---|---|---|---|
| 12 | 0.05 | 0.35 | 0.4 | 4 | 2 | 9.1 |
| 13 | 0.05 | 0.45 | 0.5 | 5 | 3 | 10.3 |
| 14 | 0.1 | 0.90 | 1.0 | 7 | 3 | 12.3 |
| 15 | 0.1 | 1.90 | 2.0 | 10 | 6 | 15.4 |
| 16 | 0.2 | 2.80 | 3.0 | 15 | 10 | 16.7 |
| 17 | 0.2 | 2.90 | 3.1 | 16 | 14 | 16.8 |

As can be seen from Table 6, in Sample Nos. 13 to 16 in which the content of magnesium was 0.05% by mass to 0.2% by mass, the total content of bismuth was 0.45% by mass to 2.8% by mass, and the total content of magnesium and bismuth was 0.5% by mass to 3.0% by mass, the thickness t of the silver-containing region 4 is 5 μm or more and 15 μm or less, the bonding strength of the metal portion 2 is a value as high as 10 MPa or more, and the linearity of the pattern of the metal portion 2 is 10 μm or less, and thus electrical insulation properties is easily secured.

Example 6

Examination was performed with respect to an effect of the average width of the grain boundary phase and the average particle size of the substrate main body 20 on the bonding strength and the reflectance.

The same processes as Examples 1 to 5 were used before a molded body was prepared using aluminum oxide (Al2O3) as a main component.

Next, firing was performed in a pusher type tunnel furnace in an oxidizing atmosphere in the air to sinter the molded body. The firing was performed so that the average particle size and the width of the grain boundary phase have values shown in Table 2 by adjusting a temperature and a firing time to 1420° C. to 1540° C. and 3.6 to 15 hours, respectively, whereby the substrate main body 20 of Sample Nos. 18 to 24 was obtained.

Furthermore, the metal portion 2 was formed by the same method as Example 1 using the substrate main body 20. As the paste for thick film printing, the paste A was used, the highest temperature of the thick film firing was set to 840° C., and the IN-OUT time was set to one hour. The metal portion 2 (conductor 34) was formed under these conditions.

In addition, a method of obtaining the average width of the grain boundary phase formed between the aluminum oxide crystal particles in the substrate main body 20 is as follows. An arbitrary cross-section of the substrate main body 20 was measured by enlarging an arbitrary point to a 50000-fold magnification through TEM observation, and a process of measuring the width of the grain boundary phase was performed with respect to a viewing field of total 10 points, and averaging the width of the grain boundary phase which was measured to obtain the average width.

In addition, a method of obtaining the average particle size of the aluminum oxide crystal is as follows. A surface of the substrate was mirror-processed, fire etching was performed at a temperature lower than the firing temperature of each sample by 80° C., element analysis according to EDS (energy-dispersive X-ray spectroscopy) was performed to specify the aluminum oxide crystal, photographing was performed at a 2500-fold magnification using a scanning electron microscope (JSM-7001 F manufactured by JEOL Ltd.) to create image data, an area of each crystal particle was obtained using an image analysis apparatus (Win ROOF manufactured by MITANI SHOJI Co., Ltd), and an equivalent circle diameter of each crystal was calculated from the area to obtain the average particle size.

A method of measuring the bonding strength of the metal portion was the same as Examples 1 to 3, and a method of measuring the reflectance of the substrate was the same as Examples 1, 2, and 4. In addition, the number of samples was set to 10, and an average value thereof was used as data.

Results that were obtained are shown in Table 7.

TABLE 7

| Sample No. | Average width of Grain boundary phase (nm) | Average particle size (nm) | Reflectance (%) | Bonding strength of Metal portion (MPa) |
| --- | --- | --- | --- | --- |
| 18 | 2.5 | 2.8 | 91.8 | 14.3 |
| 19 | 2.0 | 2.5 | 92.2 | 15.2 |
| 20 | 1.8 | 2.0 | 92.7 | 16.0 |
| 21 | 1.5 | 1.4 | 93.1 | 16.4 |
| 22 | 1.1 | 1.0 | 93.4 | 16.8 |
| 23 | 1.0 | 0.7 | 93.7 | 16.9 |

As can be seen from results shown in Table 7, in Sample Nos. 19 to 23, the average width of the grain boundary phase 13a formed between the aluminum oxide crystal particles is 2.0 nm or less, and thus the diffuse reflection light at the grain boundary phase 13a increases, and as a result, the reflectance further increases.

In addition, in Sample Nos. 20 to 23, it can be understood that the average particle size is 2.0 μm or less, and thus many grain boundary phases 13 exist and many interfaces 14a also exist. Accordingly, silver, bismuth, and magnesium contained in the metal portion 2 have a tendency to diffuse into the grain boundary phases 13, and thus the bonding strength between the substrate main body 20 and the metal portion 2 is improved.

REFERENCE SIGNS LIST

1, 100, 200: Light-emitting element mounting substrate (substrate)
2: Metal portion
2a, 2b: First electrode
2c, 2d: Reflecting layer
4: Region
4a: First region
4b: Second region
4c: Interface
5: Mounting portion
6a, 6b: Second electrode
11: Reflecting member
20: Substrate main body
30: Light-emitting device
31: Light-emitting element
t: Thickness

What is claimed is:
1. A light-emitting element mounting substrate for mounting a light-emitting element thereon, comprising:
 a substrate main body formed of a ceramic sintered body, the substrate main body containing magnesium; and
 a silver-containing metal portion containing silver as a main component, and magnesium and bismuth as accessory components,
 a silver-containing region existing in a portion of the substrate main body which faces the metal portion across a bonding portion bonding the substrate main body and the silver-containing metal portion, the silver-containing region containing silver, magnesium and bismuth.
2. The light-emitting element mounting substrate according to claim 1,
 wherein the metal portion includes at least one of a first electrode that is electrically connected to the light-emitting element, and a reflecting layer that is not electrically connected to the first electrode.

3. The light-emitting element mounting substrate according to claim 1,
wherein the substrate main body includes a mounting member having a mounting portion configured to mount a light-emitting element on a surface thereof, and a reflecting member disposed to surround the mount portion,
the silver-containing metal portion is bonded to an inner circumferential surface of the reflecting member through the bonding portion, and
the reflecting member has a silver-containing region in a portion of the reflecting member that faces the metal portion across the bonding portion.

4. The light-emitting element mounting substrate according to claim 1,
wherein the silver-containing region includes a first region on a metal portion side thereof, and
a second region adjacent to the first region, the first region contains more magnesium than the second region, and
the second region contains more bismuth than the first region.

5. The light-emitting element mounting substrate according to claim 1,
wherein a total content of magnesium and bismuth in the metal portion is 0.5% by mass or more and 3.0% by mass or less.

6. The light-emitting element mounting substrate according to claim 1,
wherein the substrate main body contains 94% by mass or more and 97% by mass or less of aluminum oxide ($Al_2O_3$) as a main component, and contains silicon oxide ($SiO2$) and magnesium oxide ($MgO$) as accessory components.

7. The light-emitting element mounting substrate according to claim 6,
wherein an average particle size of aluminum oxide crystal particles on a surface side of the substrate main body on which the light-emitting element is mounted is 2.0 µm or less.

8. The light-emitting element mounting substrate according to claim 6,
wherein the substrate main body has a grain boundary phase that is formed between the aluminum oxide crystal particles on a mounting portion-side surface of the substrate main body, and
an average width of the grain boundary phase is 2 nm or less.

9. A light-emitting device, comprising:
the light-emitting element mounting substrate according to claim 1; and
a light-emitting element mounted on the light-emitting element mounting substrate.

* * * * *